US010502763B2

(12) United States Patent
Hickman et al.

(10) Patent No.: US 10,502,763 B2
(45) Date of Patent: Dec. 10, 2019

(54) NOISE REDUCTION IN DIGITIZING SYSTEMS

(71) Applicant: TEKTRONIX, INC., Beaverton, OR (US)

(72) Inventors: Barton T. Hickman, Portland, OR (US); John J. Pickerd, Hillsboro, OR (US); Pirooz Hojabri, San Jose, CA (US); Patrick Satarzadeh, San Jose, CA (US); Khadar Baba Shaik, Davis, CA (US)

(73) Assignee: Tektronix, Inc., Beaverton, OR (US)

( * ) Notice: Subject to any disclaimer, the term of this patent is extended or adjusted under 35 U.S.C. 154(b) by 225 days.

(21) Appl. No.: 15/395,416

(22) Filed: Dec. 30, 2016

(65) Prior Publication Data

US 2017/0328932 A1 Nov. 16, 2017

Related U.S. Application Data

(60) Provisional application No. 62/335,188, filed on May 12, 2016.

(51) Int. Cl.
*G01R 13/02* (2006.01)
*H03M 1/06* (2006.01)
*H03M 1/12* (2006.01)

(52) U.S. Cl.
CPC ..... *G01R 13/0218* (2013.01); *G01R 13/0272* (2013.01); *H03M 1/0626* (2013.01); *H03M 1/12* (2013.01)

(58) Field of Classification Search
CPC . G01R 13/0218; G01R 13/0272; H03M 1/12; H03M 1/0626
See application file for complete search history.

(56) References Cited

U.S. PATENT DOCUMENTS

| 4,860,317 A | 8/1989 | Tomlinson |
| 5,233,546 A | 8/1993 | Witte |

(Continued)

FOREIGN PATENT DOCUMENTS

GB    2528847 A    2/2016

OTHER PUBLICATIONS

Jong-Hoon Kim et al, An Adaptive Equalizer for High-Speed Receiver using a CDR-Assisted All-Digital Jitter Measurement, Apr. 2015, Journal of Semiconductor Technology and Science, vol. 15, No. 2, pp. 155-167.*

(Continued)

*Primary Examiner* — Mischita L Henson
(74) *Attorney, Agent, or Firm* — Miller Nash Graham & Dunn; Andrew J. Harrington

(57) ABSTRACT

Disclosed are systems and methods related to a noise reduction device employing an analog filter and a corresponding inverse digital filter. The combination and placement of the filters within the systems aids in reducing noise introduced by processing the signal. In some embodiments, the combination of filters may also provide for increased flexibility when de-embedding device under test (DUT) link attenuation at higher frequencies. Further, the filters are adjustable, via a controller, to obtain an increased signal to noise ratio (SNR) relative to a signal channel lacking the combination of filters. Additional embodiments may be disclosed and/or claimed herein.

20 Claims, 20 Drawing Sheets

(56) References Cited

U.S. PATENT DOCUMENTS

| | | | |
|---|---|---|---|
| 2002/0019962 A1* | 2/2002 | Roberts | G01R 31/3167 714/724 |
| 2003/0025625 A1* | 2/2003 | Mizuno | G04F 10/005 341/155 |
| 2003/0149989 A1* | 8/2003 | Hunter | B82Y 10/00 725/89 |
| 2006/0052124 A1* | 3/2006 | Pottenger | H04B 1/0003 455/515 |
| 2006/0080065 A1* | 4/2006 | Pupalaikis | G01R 13/0272 702/189 |
| 2007/0217694 A1 | 9/2007 | Sullivan et al. | |

OTHER PUBLICATIONS

EESR—European Patent Office, Extended European Search Report and Written Opinion for European Patent Application 17170816.7, dated Oct. 30, 2017, 7 pages, European Patent Office, Munich, Germany.

\* cited by examiner

1600

Iteratively, receive an analog signal, convert the analog signal to a digital signal in the digital domain via an A/D converter, and increase, via an analog filter, a scale of selected high frequencies with respect to selected low frequencies of the analog signal until clipping occurs by the A/D converter.

1601

Reduce the scale until no clipping occurs by the A/D converter and/or until a specified margin is maintained between the maximum amplitude of the analog signal and the conversion capacity of the A/D converter.

NOISE REDUCTION IN DIGITIZING SYSTEMS

CROSS-REFERENCES TO RELATED APPLICATIONS

The present application claims benefit from U.S. Provisional Patent Application Ser. No. 62/335,188, filed May 12, 2016 by John J. Pickerd et al., and entitled "Oscilloscope With Application Controlled Analog CTLE Filter For Noise Reduction," which is incorporated herein by reference as if reproduced in its entirety.

FIELD OF THE INVENTION

This disclosure is directed to systems and methods associated with aspects of a digitizing system, and, more particularly, to systems and methods for reducing noise in a digitizing system.

BACKGROUND

Digitizing systems are designed to process an analog signal to produce a digitized representation of the analog signal as a digital signal. In performing this processing, a digitizing system can introduce unwanted noise into the resulting digital signal, which causes the resulting digital signal to inaccurately represent the original analog signal. While this noise may be reduced somewhat through the use of better engineering design practices or higher quality components and/or materials, under the current state of the art there can still be issues with the amount of noise introduced by even high quality digitizing systems. This can be especially problematic in areas such as, for example, digital test and measurement systems which engineers rely on to measure highly accurate representations of analog signals. In some instances, certain frequencies (e.g., high frequencies) can even be lost in the noise floor of such a test and measurement system. As such, the amount of noise introduced by a digitizing system can be a concern.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which:

FIG. 15 depicts a method of controlling an analog filter, in accordance with various embodiments of the present disclosure.

DETAILED DESCRIPTION

Figure 1:
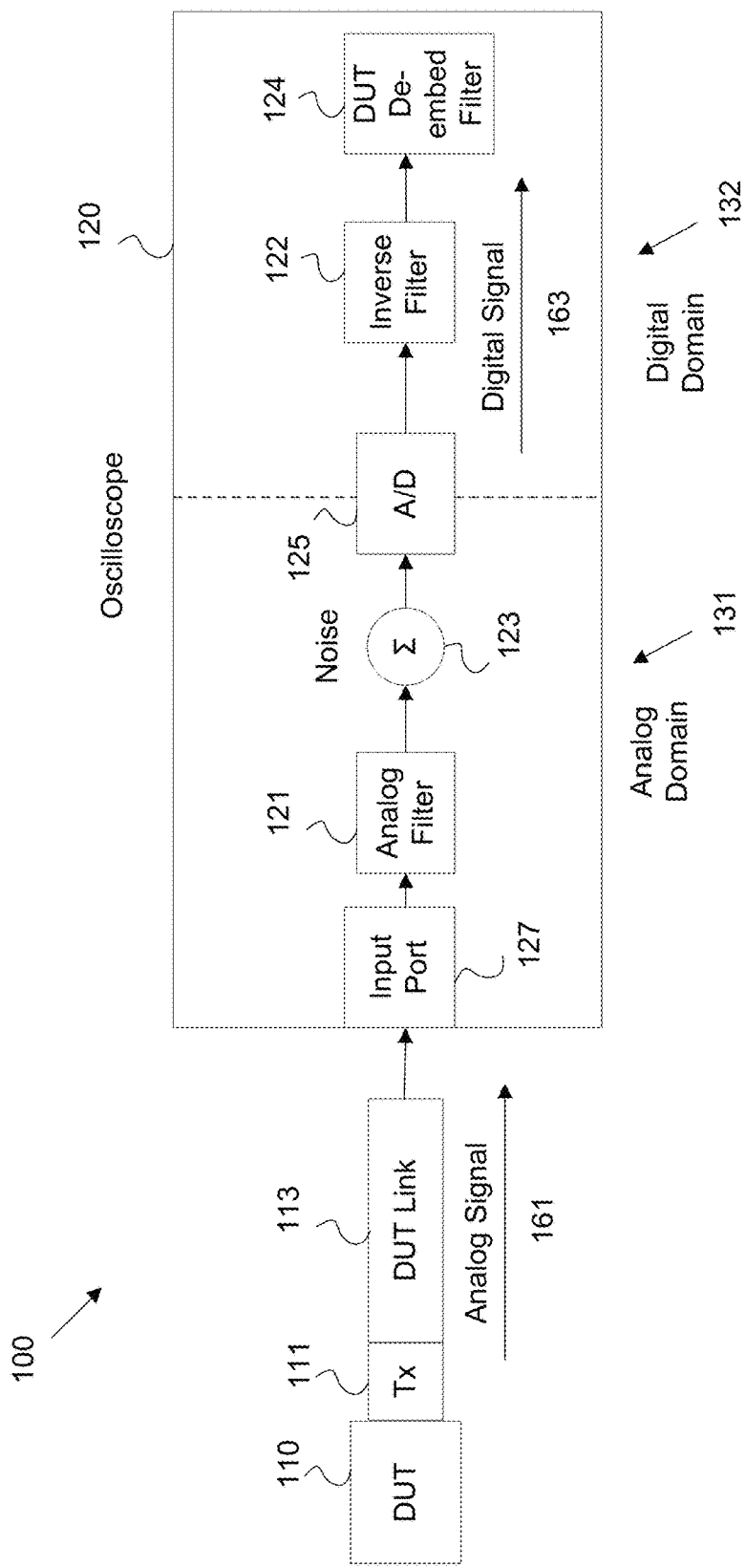
FIG. 1 depicts block diagram of a test and measurement system, in accordance with various embodiments of the present disclosure.

Briefly, the disclosed subject matter includes a noise reduction device configured to employ an analog filter prior to one or more noise sources along with a digital filter after the one or more noise. The analog filter can act to boost, or scale, an analog signal prior to the one or more noise sources (e.g., an analog-to-digital converter). This can result in the analog signal being boosted relative to the noise introduced into the signal by the noise sources. The digital filter can then substantially reverse the boosting of the analog filter returning the signal to an original level and reducing the noise in a corresponding amount.

In various instances, the noise may only occur, or occur more prevalently, at certain frequencies. In other instances, the signal may suffer from unintentional frequency specific attenuation. In either case, the analog filter may be configured to adjust, or scale, a first frequency (or frequencies) relative to a second frequency (or frequencies), e.g. adjust high frequencies relative to low frequencies, or vice versa, to boost those frequencies at which the noise may be problematic or boost those frequencies that have been unintentionally attenuated. The analog filter may be passive, in which case the low frequencies can be attenuated relative to the high frequencies. In such an example, an amplifier may then be utilized to boost the entire signal prior to the noise source. Alternatively, the analog filter may instead be active, in which case the high frequencies may be boosted relative to the low frequencies.

In some aspects, a controller may selectively adjust settings of the analog filter to provide an increased, optimal, or near optimal signal to noise ratio. Specifically, the amplitudes of the high frequencies may be scaled up as high as possible relative to the low frequencies without resulting in clipping by an analog to digital (A/D) converter. For example, in some aspects, the scale of the analog filter may be iteratively increased in the analog domain until clipping occurs in the digital domain. Then, the scale of the analog filter can be reduced until no clipping occurs. In some examples, a margin may also be maintained between the maximum amplitude of the high frequencies and the maximum conversion capability of the A/D converter.

In some aspects, user controls may allow for selective control of the analog filter. Alternatively, serial data link analysis (SDLA) may be employed to control the analog filter. In such cases, scattering (S)-parameters may also be employed to de-embed the effects of the analog filter, or any other components, from the input signal, allowing, for example, an oscilloscope to display a more accurate approximation of a signal leaving device under test (DUT). Further, an inverse filter, such as an inverse filter, may be selectively employed to remove the effects of the analog filter. For example, components of an oscilloscope (e.g., an A/D converter) may natively add some noise to the signal. The analog filter may boost the signal prior to the addition of this noise, resulting in the noise having a relatively small effect on the signal to noise ratio. The inverse filter may then reduce the gain of the signal at appropriate frequencies, which results in a corresponding reduction in the noise that was acquired in the signal between the analog filter and the inverse filter. In some instances, the analog filter may be integrated into a front end (e.g., analog side) of an A/D converter. Additionally, or alternatively, the corresponding inverse filter could be integrated into a back end (e.g., digital side) of the A/D converter. Such a configuration can be implemented, for example, where the components of the A/D converter comprise the noise source of concern.

FIG. 1 is a block diagram of an example of a test and measurement system 100 including an oscilloscope 120 configured to employ an analog filter 121 in an analog domain 131 and an inverse filter 122 in a digital domain 132. The oscilloscope 120 is configured to receive a signal under test, such as, signals from a device under test (DUT) 110 via a DUT link 113 and apply the analog filter 121 to the signals. In some embodiments, the analog filter 121 can be configured to compensate the signals for attenuation (e.g. high frequency attenuation) occurring in the DUT link 113.

The DUT 110 may be any signal source configured to communicate via electrical or optical signals. For example, DUT 110 may include a transmitter (Tx) 111 configured to transmit signals over an electrically conductive medium. In some cases, DUT 110 is a device designed to transmit signals to a corresponding receiver (not shown). The DUT 110 may be coupled to the oscilloscope 120 for testing purposes, for example when the DUT 110 is believed to be engaged in transmitting faulty signals and/or for verification of signaling accuracy for a newly designed DUT 110. DUT 110 is connected to the oscilloscope 120 via DUT link 113. The DUT link 113 may be, or include, any electrically conductive medium capable of communicating signals from the DUT 110 to the oscilloscope 120. For example, the DUT link 113 may employ electrically conductive wire, signal probes, intervening test equipment, etc. In many cases, a DUT link 113 can suffer from frequency specific attenuation. Attenuation is a gradual loss of amplitude of a signal while passing through a medium. For example, high frequency portions of a signal (e.g. frequencies in excess of 100 megahertz (MHz)) may suffer from greater attenuation than lower frequency portions of the signal (e.g. frequencies less than 100 MHz). While amplification may be employed to boost attenuated high frequencies, such amplification may also boost un-attenuated, or less attenuated, lower frequencies, which can exceed the dynamic range of the A/D converter 125 in the oscilloscope 120 and can further result in clipping and/or excessive distortion of the resulting digital signal.

Oscilloscope 120 is a test and measurement device that can be configured to address the frequency specific attenuation of the DUT link 113 without amplifying noise (e.g. from noise source 123) in the oscilloscope signal channel. This can be accomplished by employing analog filter 121, as described in greater detail below. Oscilloscope 120 includes an input port 127 configured for receiving the signal via the DUT link 113. Input port 127 can be any electrical component configured to interface with a DUT link 113, such as, for example, a plug for receiving a signal probe. The signal received at the input port is an analog signal 161. The oscilloscope 120 further includes a signal channel to conduct signals for testing. The signal channel can extend from the input port 127 to an A/D converter 125 which is configured to convert the analog signal 161 from an analog format into a digital format. Specifically, the input signal is treated by the oscilloscope 120 as an analog signal 161 until reaching the A/D converter 125 and then treated as a digital signal 163 after conversion. For clarity of discussion, components that interact with the analog signal 161 are referred to herein as acting in the analog domain 131 while components that interact with the digital signal 163 are referred to herein as acting in the digital domain 132. The boundary between the analog domain 131 and digital domain 132 is depicted as a dashed line bisecting the A/D converter 125 as the A/D converter 125 interacts with the signal in both domains. Accordingly, the A/D converter 125 is configured to convert the analog signal 161 from the analog domain 131 into a digital signal 163 in the digital domain 132.

As noted above, the oscilloscope 120 naturally includes multiple noise sources along the signal channel, depicted as a noise source 123 in the oscilloscope channel. Noise source 123 to can be, or include, any component, or combination of components in the oscilloscope 120 signal channel that generate noise. Examples of components acting as noise source 123 include, but are not limited to any number or combination of components for signal conditioning, such as probe filters, temperature compensation filters, bandwidth extension (BWE) phase and magnitude correction filters, non-linear distortion correction filters, Multiple Input Multiple Output (MIMO) interleave spur correction filters, interpolation filters, averaging filters, conditioning circuits, amplifiers, samplers, phase reference circuits, clock circuits, etc. Such noise can reduce the SNR of the digital signal 163 unless measures are taken to compensate for the noise from noise source 123. The analog signal 161 may suffer from both frequency specific attenuation and general attenuation at all frequencies when traversing the DUT link 113 and the oscilloscope 120 channel. Attenuation can be addressed by amplifying the analog signal 161. However, amplification of the entire signal 131 in the analog domain 131 to address high frequency attenuation can result in exceeding the dynamic range of the oscilloscope 120 channel, which can further result in clipping and/or excessive distortion.

Oscilloscope 120 also includes analog filter 121 in the signal channel. Analog filter 121 is a filter configured to operate in the analog domain 131 by adjusting a scale of selected high frequencies of the analog signal 161 relative to selected low frequencies of the analog signal 161. In embodiments, these frequencies can be selected to compensate for the frequency specific attenuation occurring in the DUT link 113. Because analog filter 121 is located before the noise source 123, frequency specific attenuation can be compensated for without amplifying noise from noise source 123. While depicted as being before noise source 123, it will be appreciated that additional noise sources may be included prior to analog filter 121, however, the noise source of interest is depicted as noise source 123. It will also be appreciated that, while a single noise source 123 is depicted, noise source 123 can encompass any number of noise sources, including noise introduced by A/D converter 125. The analog filter 121 can be configured with a controllable cut-off frequency and a controllable setting to provide a decibel (dB) boost to the analog signal 161. The analog filter 121 is electrically coupled between the input port 127 and the A/D converter 125. The analog filter 121 can be configured as a passive analog filter, an active analog filter, or both. An active analog filter 121 adjusts the scale by amplifying selected or specified high frequency waves in the analog signal 161 without amplifying selected or specified low frequency waves in the analog signal 161. A passive analog filter 121 attenuates the selected or specified low frequency waves in the analog signal 161 without adjusting selected or specified high frequency waves. A passive analog filter can include, for example, a continuous time linear equalizer (CTLE), an equalizer, a pre-emphasis filter, etc. Additional examples of passive and active analog filters 121 are described in reference to FIGS. 12-15 below. In either configuration, the amplitude of the high frequency signal content relative to the low frequency signal content is increased by the analog filter 121. In the case of a passive analog filter 121, an additional amplifier may be employed to increase the analog signal 161 gain. The analog filter 121 is positioned between the input port 127 and the noise source 123 to prevent amplification of noise associated with noise source 123 by the analog filter 121. The adjustment (e.g., scale, frequency breakpoint, etc.) of the analog filter 121 may be adjustable by the user via controls (e.g. via a graphical user interface), automatically adjustable by software processes, and/or fixed. In some examples, the shape, poles, zero break points, etc. of the frequency response of the analog filter 121 can be dynamically adjusted by the user (e.g. via a graphical user interface) and/or by software processes. Such shapes may include an inverse response to cable and link rolloff characteristics as a function of frequency. Further, a bypass switch (not shown) may be incorporated with the analog filter 121, allowing a user to disable the analog filter 121 as needed.

Oscilloscope 120 also includes inverse filter 122 (e.g. implemented in a digital signal processor (DSP)) in the signal channel and coupled to the A/D converter 125. Inverse filter 122 is configured to filter the digital signal 163 in the digital domain 132 with an inverse frequency response to the analog filter 121 in the analog domain 131. Accordingly, inverse filter 122 may be selectively applied to remove the scaling effects of analog filter 121 and render the digital signal 132 into substantially the same condition as the analog signal 161 at the DUT 110. Application of the inverse filter 122 removes amplification of noise (e.g. high frequency noise) caused by analog filter 121 while reducing noise generated by components in the oscilloscope 120. In other words, the inverse filter 122 cancels out the effects of analog CTLE filter 121 to allow the oscilloscope 120 to display the signal 161/163 as the signal 161/163 appeared upon entering the input port 127, but with less noise than if no analog filter 121/inverse filter 122 were employed. This is because the analog filter 121 acts to adjust, or scale, certain frequencies (e.g., higher frequencies) as compared with other frequencies (e.g., lower frequencies) of the signal, as discussed above. As such, any noise introduced between analog filter 121 and inverse filter 122 with respect to these certain frequencies is reduced by inverse filter 122 when the scaling is removed by inverse filter 122. Inverse filter 122 may be implemented as an embedded software component executed by a processor of oscilloscope 120 and applied as part of a process to de-embed effects of test and measurement system 100 occurring to the analog signal 161 after leaving the DUT 110. For example, the inverse filter 122 may be employed as part of an S parameter process included as part of an SDLA based de-embedding process. Accordingly, inverse filter 122 can reduce noise from noise source 123 by the same amount as the boost applied by analog filter 121, resulting in a net decrease in noise in the digital signal 163.

Oscilloscope 120 may also include a DUT de-embed filter 124. DUT de-embed filter 124 may be implemented in the digital domain, for example as a software filter. DUT de-embed filter 124 may be substantially similar to analog filter 121, but may employ a scale increase selected to correct for the high frequency attenuation (e.g. frequency specific attenuation) caused by propagation of analog signal 161 through the DUT link 113. Accordingly, oscilloscope 120 can display the analog signal 161 to a user as the signal appeared at the DUT 110 prior to channel loss/attenuation caused by the DUT link 113. In addition, or alternatively, the DUT de-embed filter 124 can enable other aspects of the test and measurement system, or circuits of the DUT, to be de-embedded from the signal to enable a view of the signal at any point within the DUT or the test and measurement system.

It should be noted that oscilloscope 120 further includes hardware for modifying and storing digital signal(s), such as a processor and memory. Further, the oscilloscope 120 may include a display, user controls, etc. for displaying the signal 161/163 to an end user (e.g. via a graphical user interface). The oscilloscope 120 also includes other components to capture and display waveforms of signals, as is understood by a person of ordinary skill in the art. It will be appreciated that such components are not shown in the interest of clarity.

Figure 2:
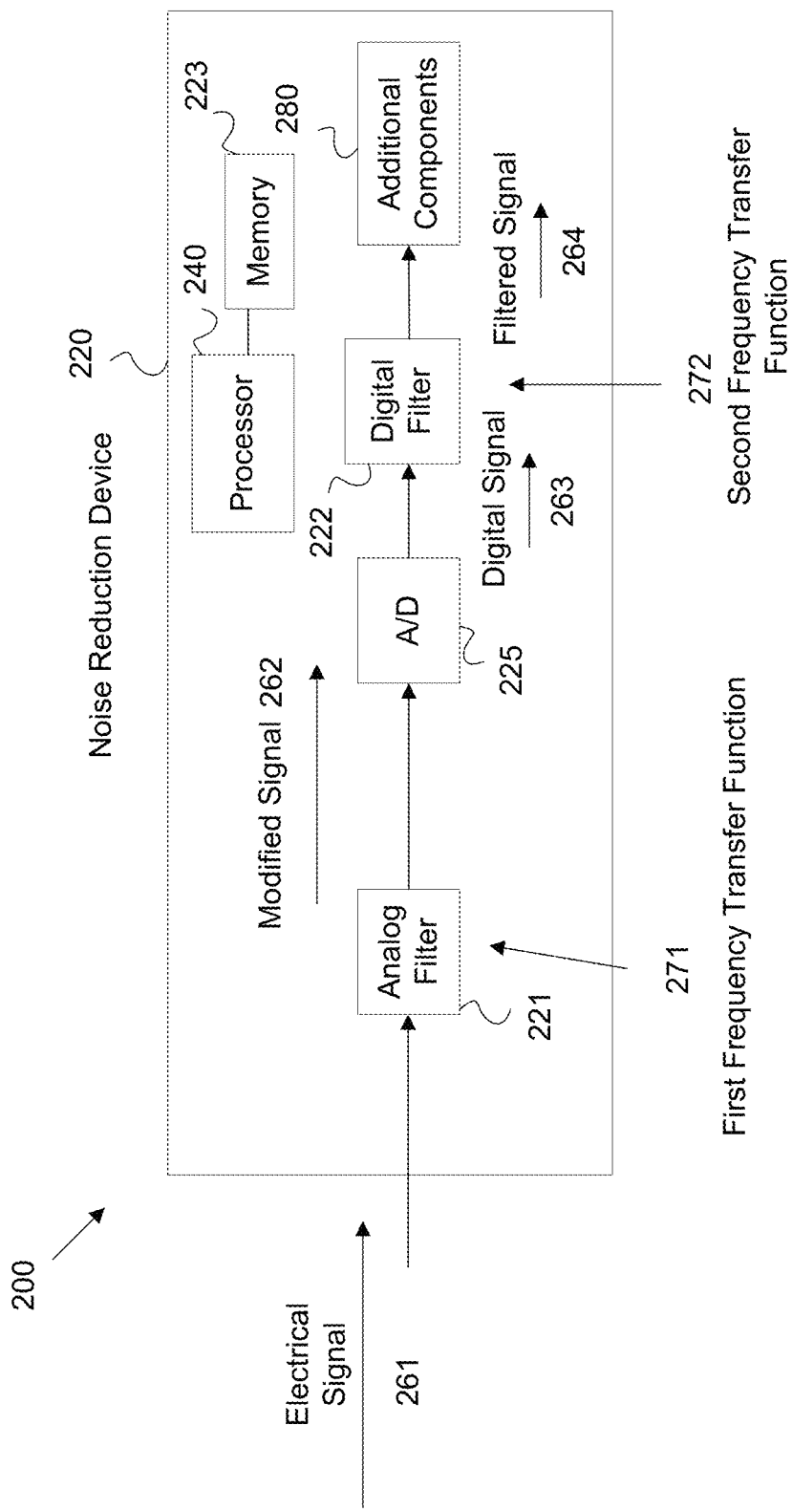
FIG. 2 depicts a block diagram of a noise reduction device, in accordance with various embodiments of the present disclosure.

FIG. 2 is a block diagram of an example of a system 200 including a noise reduction device 220, in accordance with various embodiments of the present disclosure. Noise reduction device 220 includes an analog filter 221, an A/D converter 225, a digital filter 222, and additional components 280.

Analog filter 221 is an analog filter, such as a CTLE. Analog filter 221 is configured to receive an electrical signal 261, which may be similar to analog signal 161. Analog filter 221 is configured to adjust/scale/modify a first frequency (e.g. high frequency) of the electrical signal relative to a second frequency (e.g. low frequency) of the electrical signal to produce a modified signal 262. The analog filter 221 scales the first frequency relative to the second frequency in accordance with a configurable first frequency transfer function 271. A transfer function is a mathematical function relating the output or response of a system such as a filter circuit to the input or stimulus. It should be noted that the electrical signal 261 and the modified signal 262, when taken together, may be substantially similar to analog signal 161. The analog filter 221 may be an active filter configured to boost the first frequency of the electrical signal 261 relative to the second frequency of the electrical signal 261 to produce the modified signal 262. The analog filter 221 may alternatively be a passive filter configured to attenuate the second frequency of the electrical signal 261 relative to the first frequency of the electrical signal 261. In such case, a separate amplifier may also be included and configured to boost both the first frequency and the attenuated second frequency to produce the modified signal 262.

In some aspects, the analog filter may have a peaked frequency response to accomplish the scaling or boosting of the first frequency band relative to the second frequency band. Such a peaked frequency response can have a positive gain slope. The peaking can be selected to be substantial, e.g., greater than 5 decibels (dB), or more than 10 dB, or more, in an effort to increase the SNR of a resulting digital signal, much more than is necessary to compensate for losses in the system. For example, a 20 dB boost can improve the SNR of the resulting signal by approximately 12 dB. The result of this peaking is that the waveform of the analog signal applied to the A/D converter may be very different from that of the input electrical signal 261. In fact, it has been intentionally distorted, and thus requires digital post-processing to compensate for that, which will advantageously reduce noise as explained herein. In other aspects, as discussed elsewhere herein, the frequency response can be dynamically adjusted based on the limits of A/D converter 225, as such, the amount of peaking can be dependent on the A/D converter being utilized. In addition, or alternatively, the peaking can be dependent on the signal being processed, because the amplitude of frequencies within the signal being processed could impact the amount of peaking that can be applied within the bounds of the A/D converter. This peaking can be intentionally selected to address noise within the frequency band being scaled (e.g., a high frequency band). In some instances, the peaking may be selectable by a user of the noise reduction device.

The modified signal 262 is received by an A/D converter 225, which is substantially similar to A/D converter 125. The A/D converter 225 is coupled to an output of the analog filter 221 via any intervening analog circuits. The A/D converter 225 is configured to produce a digital signal 263 based on the modified signal 262.

The digital signal 262 is received by digital filter 222. The digital signal 262 may be substantially similar to inverse filter 122 and/or DUT de-embed filter 124. The digital filter 222 is coupled with the analog-to-digital converter 225 and is configured to produce a filtered signal 264 from the digital signal 263. The filtered signal 264 and the digital signal 263, when taken together, may be substantially similar to digital signal 163. The digital filter 222 produces the filtered signal 264 based on a second frequency transfer function 272 that is substantially an inverse of the first frequency transfer function 271. In other words, the second frequency transfer function 272 may be selected to remove the effects of the first frequency transfer function 271 from the digital signal 263 so that the digitized signal is a substantially identical representation of electrical signal 261, resulting in filtered signal 264. The digital filter may also be configured to de-embed parasitic effects associated with the analog filter 221 from the filtered signal 264. The digital filter 222 outputs the filtered signal 264 for additional processing (e.g., by a test and measurement system), for example by additional components 280. Additional components 280 may be any hardware or software components configured to process, store, modify, and/or display signals 261-264 to a user.

The noise reduction device 220 may also include a processor 240, which may be similar to controller 440, discussed below. The processor 240 may be configured to control the components of noise reduction device 220. The noise reduction device 220 may also include memory 223, which may act as a non-transitory storage medium for storing instructions (e.g. a computer program product) for use by the processor 240. The processor 240 may select a scale of the first frequency transfer function 271 to increase a Signal to Noise Ratio (SNR) of the modified signal 262. The processor 240 may also receive S-parameters describing parasitic effects associated with the analog filter 221, and employ the S-parameters as part of an SDLA process to cause the digital filter 222 to de-embed the parasitic effects associated with the analog filter 221. The processor 240 may also adjust the first frequency transfer function 271 by iteratively increasing a scale of the first frequency relative to the second frequency until a maximum amplitude of the modified signal 262 exceeds a conversion capacity of the A/D converter 225, which may cause clipping. The processor 240 may then adjust the first frequency transfer function 271 to decrease the scale of the first frequency relative to the second frequency until no clipping occurs and set the second frequency transfer function accordingly (e.g., an inverse to the first frequency transfer function). Further, the processor 240 may also maintain a specified margin between the maximum amplitude of the modified signal 262 and the conversion capacity of the A/D converter 225. In addition, or in the alternative, the processor 240 may perform any other method disclosed herein, such as methods 1500, 1600, and/or 1700.

It should also be noted that system 200 may be implemented as in any test and measurement instrument (e.g., oscilloscope), such as system 100 and/or in a separate filter, such as system 700. Further, system 200 may be employed to implement corresponding methods, apparatus(es), systems, etc.

In one instance, the noise reduction device 220 could be implemented in an A/D converter. In such an instance, the analog filter would be placed prior to one or more noise sources of concern in the A/D converter and the digital filter would be placed after these noise sources.

Figure 3:
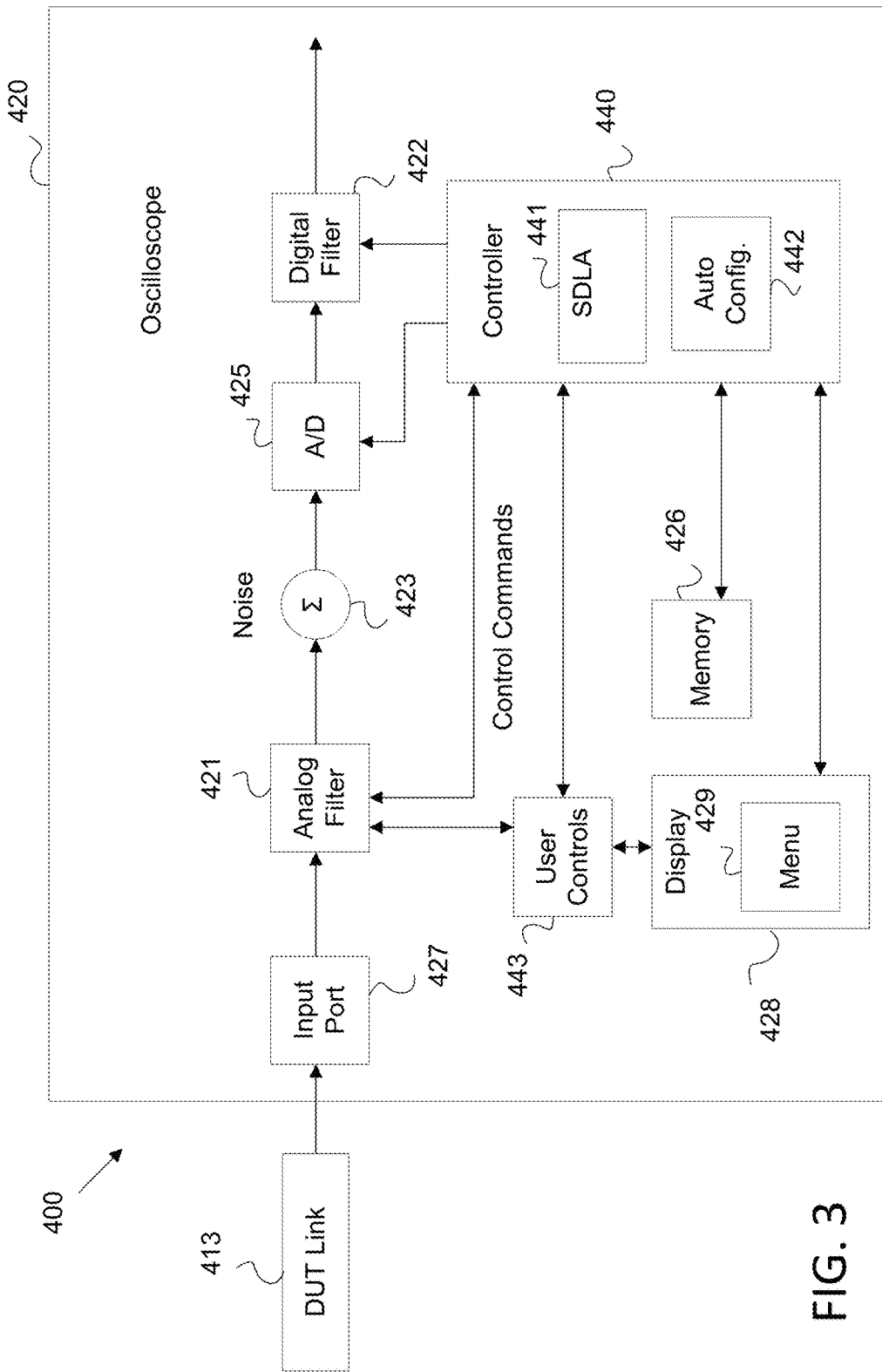
FIG. 3 depicts another block diagram of a test and measurement system, in accordance with various embodiments of the present disclosure.

FIG. 3 is a block diagram of an example of a test and measurement system 400 including an oscilloscope 420 configured to employ an analog filter 421 and digital filter 422 controlled by employing a serial data link analysis (SDLA) 441 interface. System 400 includes DUT link 413, oscilloscope 420, input port 427, noise source 423, A/D converter 425, analog filter 421, which are all substantially similar to DUT link 113, oscilloscope 120, input port 127, noise source 123, A/D converter 125, analog filter 121, respectively. Oscilloscope 420 also includes digital filter 422, which may be any software or hardware filter to be applied to a digital signal, such as an inverse filter (e.g. inverse filter 122) or any other digital domain filter that can be dynamically controlled. For example, as depicted, digital filter 422 may be implemented as a digital signal processor (DSP). Digital filter 422 may also include bandwidth limiting filters, de-embedding filters based on SDLA 441 S-parameters, etc.

Oscilloscope 420 also includes a controller 440, a memory 426, a display 428, and user controls 443, each of which may be employed in conjunction with other oscilloscopes discussed herein (e.g. oscilloscope 120, etc.), and which collectively control the analog filter 421, A/D converter 425, and digital filter 422 as well as any other oscilloscope components. For example, controller 440 is configured to dynamically configure analog filter 421, A/D converter 425, and/or digital filter 422 based on user commands, instructions stored in memory, etc. Controller 440 is any hardware component configured to control the components in the oscilloscope 420. For example, the controller 440 may include a general purposes processor, an application specific integrated circuit (ASIC), a Field Programmable Gate Array (FPGA), a DSP, etc. Controller 440 is configured to execute instructions from memory 426 and/or implement any methods discussed herein, such as methods 1600 and/or 1700 as described in detail below. Controller 440 may be configured to operate, in accordance with the instructions, an SDLA 441 component and an auto configure 442 component. SDLA 441 component may be configured to employ controller 440 to employ S-parameters to de-embed the electrical effects of oscilloscope 420 components, or any subset thereof, on the signals traversing the signal channel. Auto configure 442 component is configured to employ the controller 440 to adjust the analog filter 421 and/or digital filter 422 to increase, or optimize, the SNR of the signal, for example based on user input or stored instructions. For example, auto configure 442 component is configured to cause the controller to iteratively adjust the analog filter 421 in the analog domain to increase, or optimize, the SNR of the digital signal in the digital domain. An illustrative process for increasing, or optimizing, the SNR of the digital signal in the digital domain is discussed in greater detail below and depicted by method 1700 of FIG. 17. Auto configure 442 component can operate in conjunction with or independently of SDLA 441 component, depending on the example. Further, SDLA 441 component may not be employed in all examples.

Memory 426 may be any component(s) configured to store instructions, such as volatile random access memory (RAM), non-volatile RAM, read only memory (ROM), or any other machine-readable medium or combination thereof. Memory 426 may also be configured to store S-parameters, control files for the controller 440, and/or sampled waveforms captured from the signal received from the DUT link 413.

Display 428 may be a digital screen or a cathode ray tube based display. Display 428 can include one or more graticules for displaying corresponding input signals, for example as eye diagrams, histograms, heat maps, time domain signals, frequency domain signals, etc. Display 428 may include a menu 429, which includes a graphical user interface for displaying potential user commands, confirmation of actions taken, etc. For example, menu 429 may contain controls to allow a user to alter the frequency response shape, poles, zero break points, etc. associated with analog filter 421. Oscilloscope 420 also includes user controls 443 coupled to the controller 440, display 428, and/or analog filter 421. User controls 443 may include strobe inputs, gain controls, triggers, display adjustments, power controls, or any other controls employable by a user to display an input signal on display 428. User controls 443 may also allow the user to select particular measurements or actions to be taken when analyzing a signal. In some examples user controls 443 are integrated into display 428, for example via a touch screen.

The user controls 443 may be configured to select frequency bounds for the selected high frequencies and the selected low frequencies based on received user input. It should be noted frequency bounds may also be selected by other means, such as based on data stored in internal/external memory. The user controls 443 may also adjust the analog filter 421 in the analog domain to increase or optimize the SNR of the corresponding digital signal in the digital domain. For example, a user can employ the user controls 443 to input S-parameters for use by the controller 440 in de-embedding. Such S-parameters may also be input to memory 426 for use by the controller 440, for example via transfer of files from an external memory device, a network connection, etc. The user controls 443 may also be employed to select control signal amplification, the transfer function applied by the analog filter 421 and/or digital filter 422, etc. As an example, the controller 440 may employ the auto configure 442 component to adjust the analog filter 421 to obtain an increased or optimal SNR. The user controls 443 may then be employed to adjust the analog filter 421 as needed to change the waveform output on the display 428 as desired by the user. The user controls 443 can interact with the analog filter 421 directly and/or via controller 440. For example, the user controls 443 may forward commands to the controller 440, which then forwards commands, such as SDLA programmatic interface (PI) commands, to the analog filter 421 based on the S-parameters to control the analog filter 421, de-embed the analog filter 421, etc.

Figure 4:
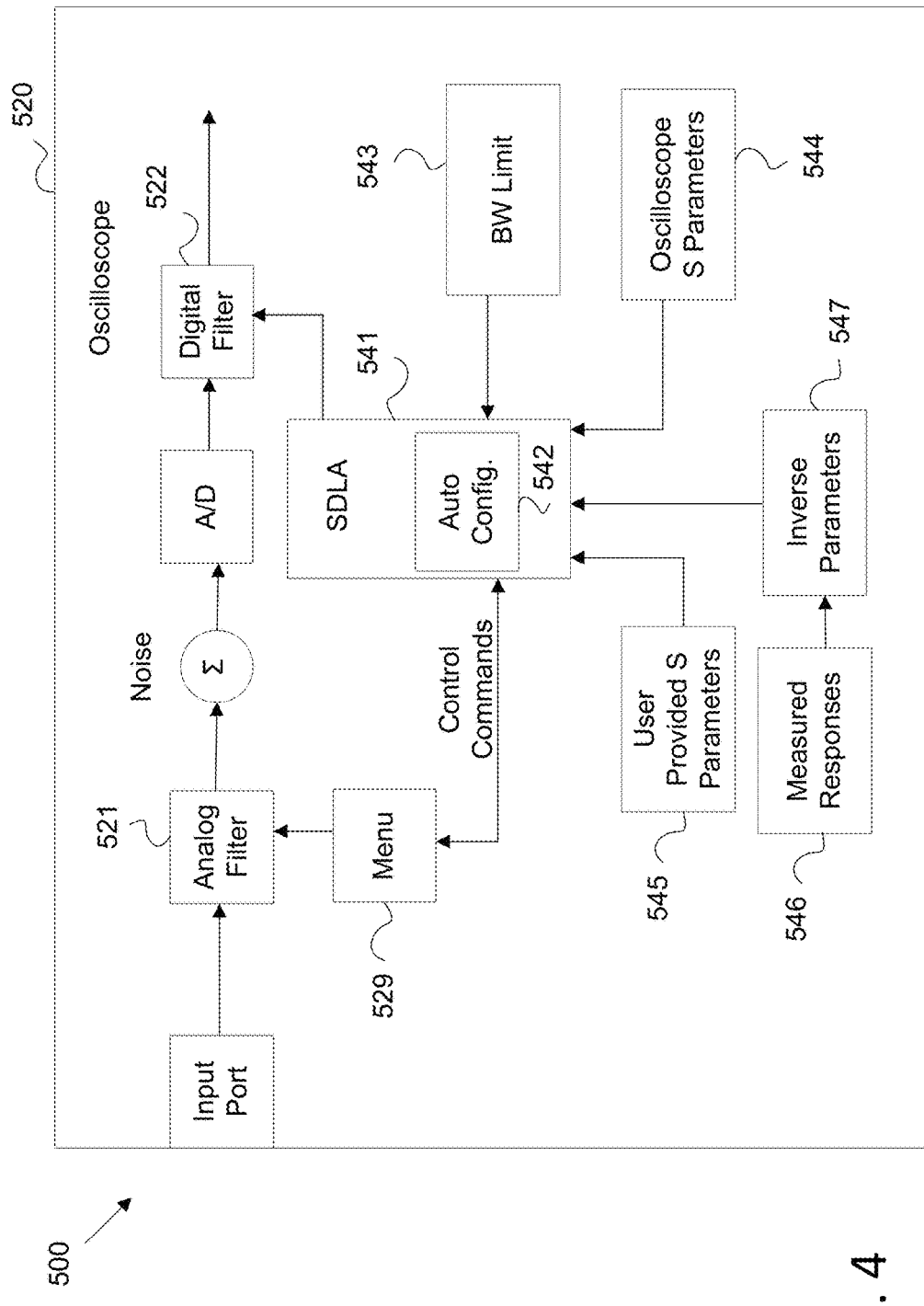
FIG. 4 is a functional depiction of a test and measurement system, in accordance with various embodiments of the present disclosure.

FIG. 4 is a functional illustration of an example of a test and measurement system 500 including an oscilloscope 520 configured to employ an analog filter 521 and a digital filter 522 controlled by SDLA 541. System 500 is substantially similar to system 400, but is shown in terms of functional component interaction instead of example hardware. Oscilloscope 520 includes an analog filter 521, noise source (represented as 'Σ'), A/D converter (represented as 'A/D'), and filter 522 all positioned along a signal channel in a manner similar to oscilloscope 420. Analog filter 521 may be an active or passive analog filter as discussed above, and digital filter 522 may be substantially similar to digital filter 422. Analog filter 521 receives an analog signal (e.g., from a DUT link) and forwards the signal along the channel via digital filter 522.

Analog filter 521 and digital filter 522 are controlled by a processor/controller operating an SDLA component 541, which is substantially similar to SDLA interface 441. SDLA component 541 receives various inputs, including user provided S-parameters 545, measured responses 546, inverse filters 547, oscilloscope S-parameters 544, and/or a bandwidth (BW) limit 543. User provided S-parameters 545 can be received from a user via user controls and/or memory. User provided S-parameters 545 can describe the electrical effects that the DUT link and/or any other component(s) of test and measurement system 500 have on the analog signal prior to reaching the oscilloscope 520. It will be appreciated that, while described as being user provided, user provided S-parameters 545 could also be provided in any other suitable manner (e.g., from a memory or other data store), without departing from the scope of this disclosure. The oscilloscope S-parameters 544 may describe the electrical effects the oscilloscope's 520 components have on the signal. For example, the oscilloscope S-parameters may describe the electrical effects of analog filter 521, digital filter 522, A/D converter, etc. and can be received at the SDLA component 541. The oscilloscope S-parameters 544 may be stored and retrieved from system memory. BW limit 543 indicates an amount of information that can be correctly sampled due to the limitations of the oscilloscope 520 hardware. For example, BW limit 543 may indicate the maximum sampling frequency, maximum A/D conversion capabilities, maximum amplification, or adjustment, possible by analog filter 521 and/or other signal processing components, and/or any other information defining the bandwidth limits on oscilloscope's 520 capabilities. SDLA component 541 employs the user provided S-parameters 545, oscilloscope S-parameters 544, and BW limit 543 to determine how to de-embed the effects of the oscilloscope 520, the DUT link, and/or any other system hardware from the captured waveform based on the received signal. The available system responses are employed to generate commands (e.g., PI commands) for transmission to a menu 529 via an SDLA 541 interface.

The menu 529 may be displayed on a display, such as display 428 as shown in FIG. 2, and may accept user commands. Via the menu, the user may select relevant system responses, allowing for selectively de-embedding various components. For example, the user may de-embed some components, but not others. This allows the user to see the properties of the signal existing at any point in the system or DUT. For example, the SDLA component 541 can employ S-parameters of the analog filter 521 to de-embed electrical effects of the analog filter 521 from the analog signal or the digital signal. The user may also employ the menu to set the boundaries for low and high frequencies to be adjusted by the analog filter 521, set sampling triggers, set other signal processing requirements, etc. Based on the user input, the appropriate commands from the SDLA component 541 can be sent to the analog filter 521. The SDLA component may also include an auto configure 542 component, which is substantially similar to auto configure 442 component. Based on the user commands from menu 529, the SDLA component 541 can employ the auto configure 442 to iteratively adjust the analog filter 521 via the SDLA commands via the SDLA interface.

Further, the oscilloscope 520 can measure the signal traversing the oscilloscope 520 signal channel and store such measurements in memory. The SDLA component 541 can retrieve such measurements from memory as measured responses 546. The measured responses 546 can be received as input at the SDLA component 541 and employed as part of a feedback control system to iteratively adjust the analog filter 521. Further, the measured responses 546 can be employed to calculate a desired response for an inverse filter 547 to remove the electrical effects (e.g., frequency response shape) of the analog filter 521 from the measured digital signal as discussed with respect to FIG. 1. As such, the SDLA component 541 can employ the calculated inverse filter 547, which can in turn be employed to set digital filter 522 as an inverse filter to act in a manner similar to inverse filter 122 of FIG. 1. As such, the SDLA component 541, can be configured to employ S-parameters and commands to iteratively and continuously control the analog filter 521 and/or an inverse filter at digital filter 522 to adjust for noise or attenuation (e.g., frequency specific attenuation in a DUT link) without amplifying oscilloscope channel noise and/or de-embed associated oscilloscope 520 components as needed based on user commands. Further, SDLA component 541 can also be employed to implement any of the methods disclosed herein, such as methods 1600 and/or 1700 described in detail below.

Figure 5:
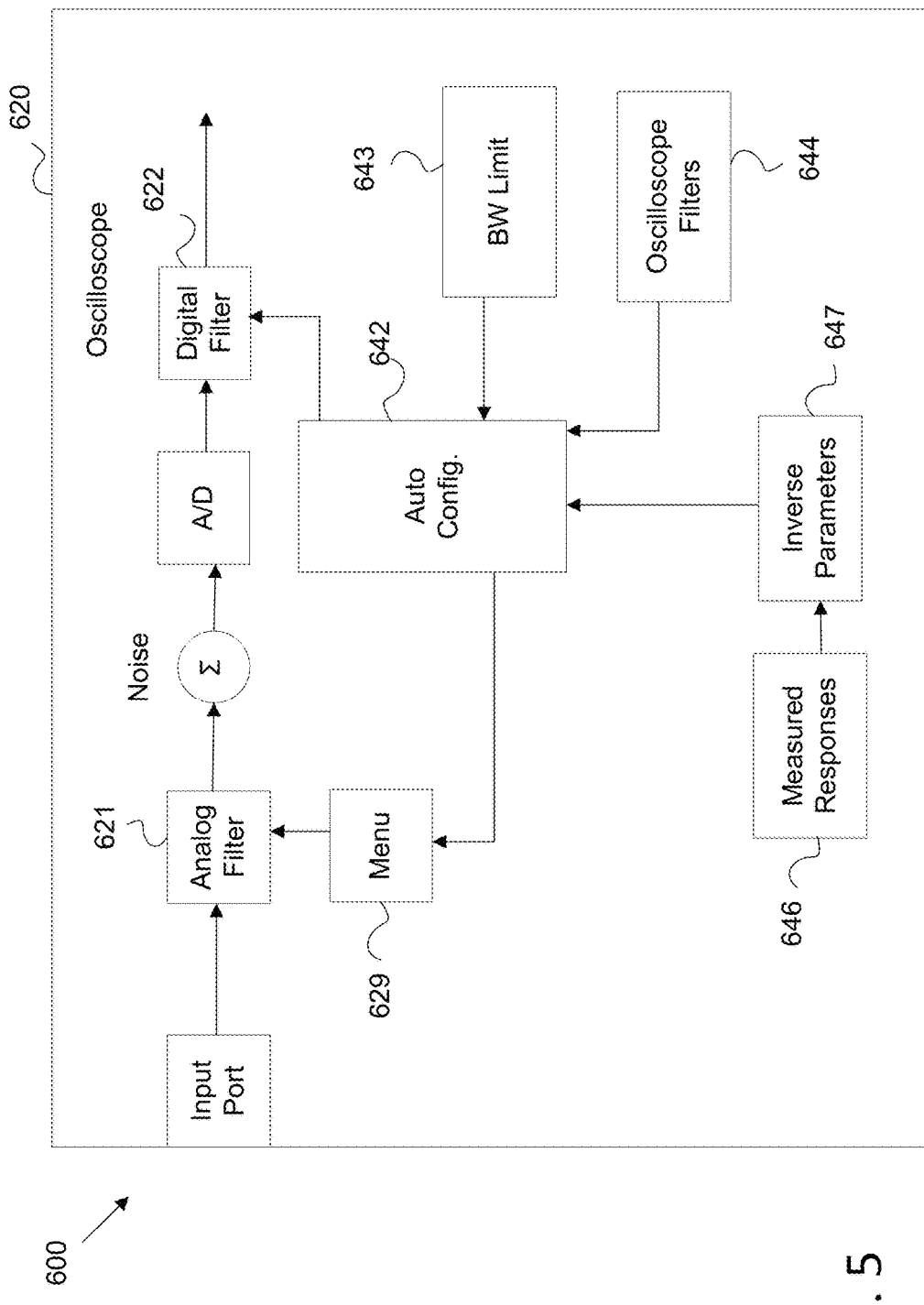
FIG. 5 is another functional depiction of a test and measurement system, in accordance with various embodiments of the present disclosure.

FIG. 5 is a functional illustration of an example of a test and measurement system 600 including an oscilloscope 620 configured to employ an analog filter 621 and a digital filter 622 controlled without SDLA. System 600 is substantially similar to system 500, but is implemented without SDLA, S-parameters, or control commands. Oscilloscope 620, menu 629, analog filter 621, digital filter 622, BW limit 643, measured responses 646, and inverse filter parameters 647 are substantially similar to oscilloscope 520, menu 529, analog filter 541, digital filter 522, BW limit 543, measured responses 546, and inverse filter parameters 547, respectively. Auto configure 642 component is substantially similar to auto configure 542 component, but is implemented without SDLA. Accordingly, auto configure 642 component adjusts/controls the analog filter 621 and/or digital filter 622 directly without employing S-parameters for de-embedding. Specifically, the auto configure 642 component can iteratively adjust the gain of analog filter 621 to increase or nearly optimize the SNR of the digital signal based on the measured responses 646 based on user instructions received from menu 629. The auto configure 642 component can also calculate inverse filter parameters 647 from the measured responses 646 and employ the inverse filter parameters 647 to adjust digital filter 622 to act as an inverse filter corresponding to analog filter 621. The auto configure 642 can also consider the BW limit 643 of the oscilloscope 620 as well as any other oscilloscope filters 644 to be applied to the signal when setting filter 622. As such, the auto configure 642 component, can be configured to iteratively and continuously control the analog filter 621 and/or digital filter 622 to adjust for frequency specific noise and/or attenuation (e.g., from DUT link) without amplifying downstream oscilloscope channel noise as needed based on user commands. Further, auto configure 642 component can also be employed to implement any of the methods disclosed herein, such as methods 1600 and/or 1700.

Figure 6:
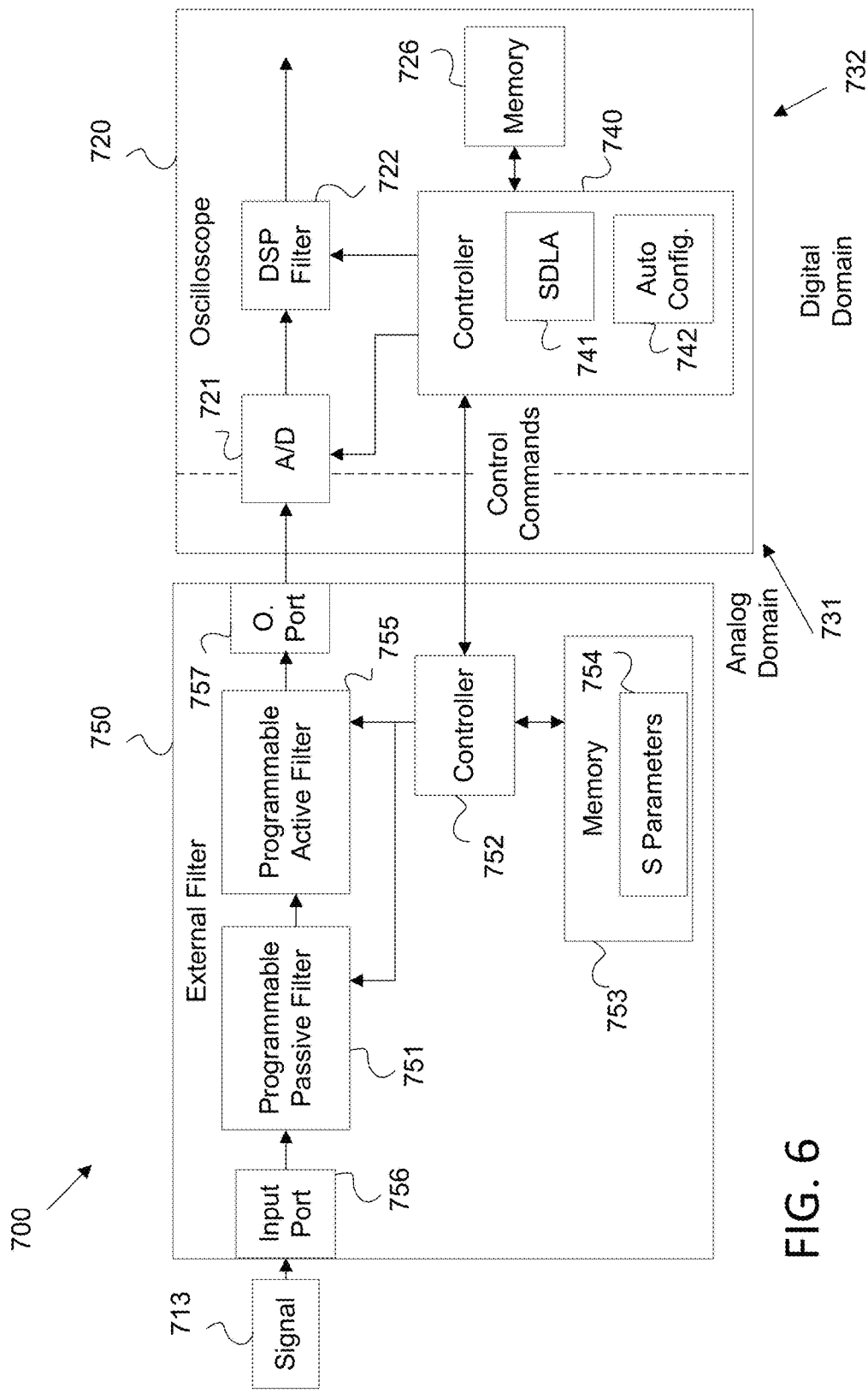
FIG. 6 depicts another block diagram of a test and measurement system, in accordance with various embodiments of the present disclosure.

FIG. 6 is a block diagram of an example of a test and measurement system 700 including an oscilloscope 720 configured to control an external filter 750. Oscilloscope 720 is substantially similar to oscilloscope 420 of FIG. 4, but does not include an internal analog filter. Oscilloscope 720 includes an A/D converter 721, a DSP filter 722, a controller 740, memory 726, SDLA 741 component, auto configure 742 component, an analog domain 731, and a digital domain 732 which are substantially similar to A/D converter 425, digital filter 422, controller 440, memory 426, SDLA component 441, auto configure 442 component, analog domain 131, and digital domain 132, respectively. System 700 receives signal 713. In some embodiments, signal 713 can be received over a DUT link, such as, for example, a DUT link similar to DUT link 113 of FIG. 1. In such embodiments, signal 713 may suffer from attenuation (e.g. frequency specific attenuation). Signal 713 can be received by external filter 750. Oscilloscope 720 also includes an input port coupled with an output port 757 of external filter 750.

The external filter 750 includes a programmable passive filter 751, a programmable active filter 755, a controller 752, and memory 753, including S-parameters 754 specific to the external filter 750. Programmable passive filter 751 and programmable active filter 755 can operate in a similar manner to analog filter 121. However, programmable passive filter 751 can be configured to scale, or adjust, frequencies of signal 713 by attenuating selected low frequencies, while programmable active filter 755 can be configured to scale signal 713 by amplifying selected high frequencies. In some embodiments, programmable passive filter 751 and programmable active filter 755 may be selected/controlled to have different frequency responses that can be employed in series, or individually, on an incoming analog signal. As such, employing both programmable passive filter 751 and programmable active filter 755 may provide a user with more signal processing options than employing a single active or passive filter. While two filters are shown, it should be noted that in some examples the external filter 750 can include either the programmable passive filter 751 or the programmable active filter 755, rather than both. In other examples, both the programmable passive filter 751 and the programmable active filter 755 are employed, but can be switched into a parallel configuration (e.g. from a serial configuration) to provide a user the option of selecting which filter, or combination thereof, to use for a particular application. Regardless of configuration, the external filter 750 includes an input port 756 that can receive signal 713 (e.g., via a DUT link) and an output port 757 that can be coupled with the input port of the oscilloscope 720. The external filter 750 further includes a signal channel between the input port 756 and output port 757. The programmable passive filter 751 and the programmable active filter 755 are positioned in the external filter's 750 signal channel and coupled with the input port 756 and/or output port 757 according to the configuration employed.

The memory 753 is similar to memory 426, and includes instructions for controller 752 as well as S-parameters 754 that are specific to external filter 750. The S-parameters 754 can be employed to de-embed the effects of input port 756, programmable passive filter 751, programmable active filter 755, output port 757, and/or any other circuitry in external filter's 750 signal channel from the analog signal.

Controller 752 is similar to controller 440, and is configured to communicate with controller 740, for example VIA SDLA PI commands, and control programmable passive filter 751, programmable active filter 755, and any other external filter 750 components based on commands from controller 740. Accordingly, controller 752 is coupled with controller 740, for example via a cable. A DUT link can be coupled to input port 756 to propagate signal 713 to external filter 713, for example via a second cable and/or signal probe. Output port 757 is coupled to oscilloscope's 720 input port, for example via a third cable. In such configuration, a signal can traverse a signal channel from the DUT link through the external filter 750 via any combination of filters 751 and 755 and into the oscilloscope 720 for sampling. The controller 740 can then communicate with controller 752 to control the filters 751 and/or 755 to obtain a desired frequency response. Such control can be performed with or without SDLA, S-parameters, and/or PI commands. Further, controller 752 may perform de-embedding at external filter 750 or forward S-parameters 754 to controller 740 to allow de-embedding to occur at controller 740 via SDLA 741. In addition, controller 752 may forward current settings of filters 751 and/or 755 to controller 740 as needed to support computation of corresponding inverse parameters for DSP filter 722.

As such, oscilloscope 720 includes an input port configured to receive an analog signal 713 from a DUT and an external filter 750. The A/D converter 721 is configured to convert the analog signal from an analog domain 731 to a digital signal in a digital domain 732. The controller 740 is then configured to determine measurements of the digital signal in the digital domain 732. Based on the measurements, the controller 740 controls the external filter 750, via controller 752, to adjust the scale of selected high frequencies of the analog signal 713 relative to selected low frequencies of the analog signal 713. Such adjustments can, for example, compensate for attenuation (e.g. frequency specific attenuation) occurring in the analog domain, e.g., attenuation by a DUT link, based on the SNR of the digital signal as measured in the digital domain (e.g. by controller 740).

Further, controller 740 can be configured to implement methods 1600 and/or 1700 by communicating with and/or controlling controller 752. For example, controller 740 can command the external filter 750, via controller 752, to select particular high and low frequencies based on user commands. Then controller 740 can iteratively command external filter 750 to increase the scale of the selected high frequencies to the selected low frequencies. The scale can be increased until a maximum amplitude of the digital signal in the digital domain 732 exceeds a conversion capacity of the A/D converter 721, which results in clipping. The controller 740 can then command the external filter 750 to reduce the scale provided by the filters 751 and/or 755 until no clipping occurs. Further, the controller 740 can, in some aspects, command the external filter 750 to reduce the scale until a specified margin is maintained between the maximum amplitude of the digital signal and the conversion capacity of the A/D converter 721.

Figure 7:
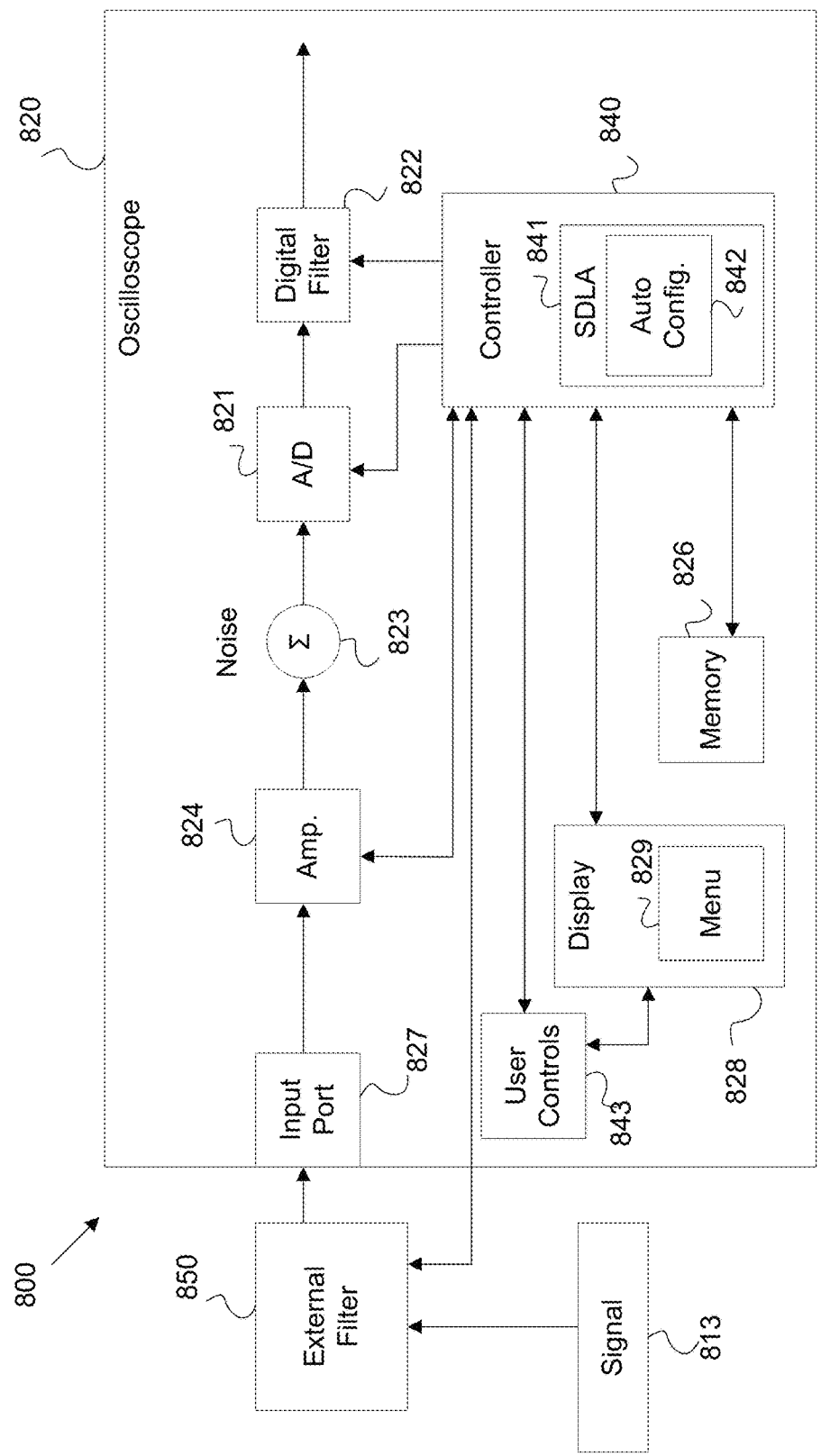
FIG. 7 depicts yet another block diagram of an example of a test and measurement system, in accordance with various embodiments of the present disclosure.

FIG. 7 is a block diagram of an example of a test and measurement system 800 including an oscilloscope 820 configured to control an external filter 850 by employing an SDLA interface. System 800 is substantially similar to system 700, but depicts hardware of oscilloscope 820 in more detail. Signal 813 and external filter 850 are substantially similar to signal 713 and external filter 750, respectively. Oscilloscope 820 includes a signal channel with an input port 827, a noise source 823, an A/D converter 821, and a digital filter 822, which are substantially similar to input port 427, noise source 423, A/D converter 425, and digital filter 422, respectively. Oscilloscope 820 does not include an internal analog filter, and hence employs an amplifier 824 to amplify the analog signal at all frequencies to increase an amplitude, or power, of the signal being processed. In other embodiments, such amplification could be performed by programmable active filter 755. In such embodiments, amplifier 824 could be omitted. Amplifier 824 may be any electronic device that increases the power of a signal. The analog signal is received at the input port 827 and is amplified by amplifier 824. The analog signal is then processed by the various circuitry that introduce noise 823. The analog signal is then converted to a digital signal by A/D converter 821. While depicted separate from noise 823, it will be appreciated that the individual components depicted (e.g., A/D converter 821) can also contribute to noise 823. However, these components are depicted separately for ease of discussion. The resulting digital signal is then filtered by digital filter 822, which can have a frequency response shape that is an inverse of amplifier 824, programmable passive filter 751, and/or programmable active filter 755. By amplifying the signal 813 prior to noise 823, the signal 713 is amplified relative to the noise 823. Subsequent filtering by digital filter 822 can reverse the amplification, or scaling, applied to signal 813 by external filter 850 or amplifier 824, thus reducing the signal 713 back to an original level, while reducing noise 823 in a corresponding amount. The resulting signal can then be stored in memory 826 and/or displayed as a waveform on display 828.

Oscilloscope 820 further includes user controls 843, controller 840 including SDLA component 841 and auto configuration component 842, memory 826, display 828, and menu 829, which are substantially similar to user controls 443, controller 440, SDLA component 441, auto configure 442 component, memory 426, display 428, and menu 429, respectively. Auto configuration component 842 can be configured to operate independently and/or in conjunction with SDLA component 841 to control external filter 850, amplifier 824, etc. For example, user controls 843 are configured to select frequency bounds for the selected high frequencies and the selected low frequencies based on received user input. User controls 843 may also receive S-parameters and/or other instructions from the user, for example via display 828 and/or menu 829. Such input is forwarded to controller 840, which obtains other relevant data from memory 826. Based on the user input and/or data from memory 826, the CTLE auto configure 442 component iteratively adjusts the external filter 850 in order to increase the digital signal based on measurements taken downstream of the A/D converter 821. Further, the controller 840 communicates with external filter 850 to obtain S-parameters associated with the external filter 850. Based on the S-parameters and/or user inputs, the SDLA component 841 de-embeds the effects of the external filter 850 and the components of oscilloscope 820 from the signal 813 to reduce signal noise and further increase SNR.

Figure 8:
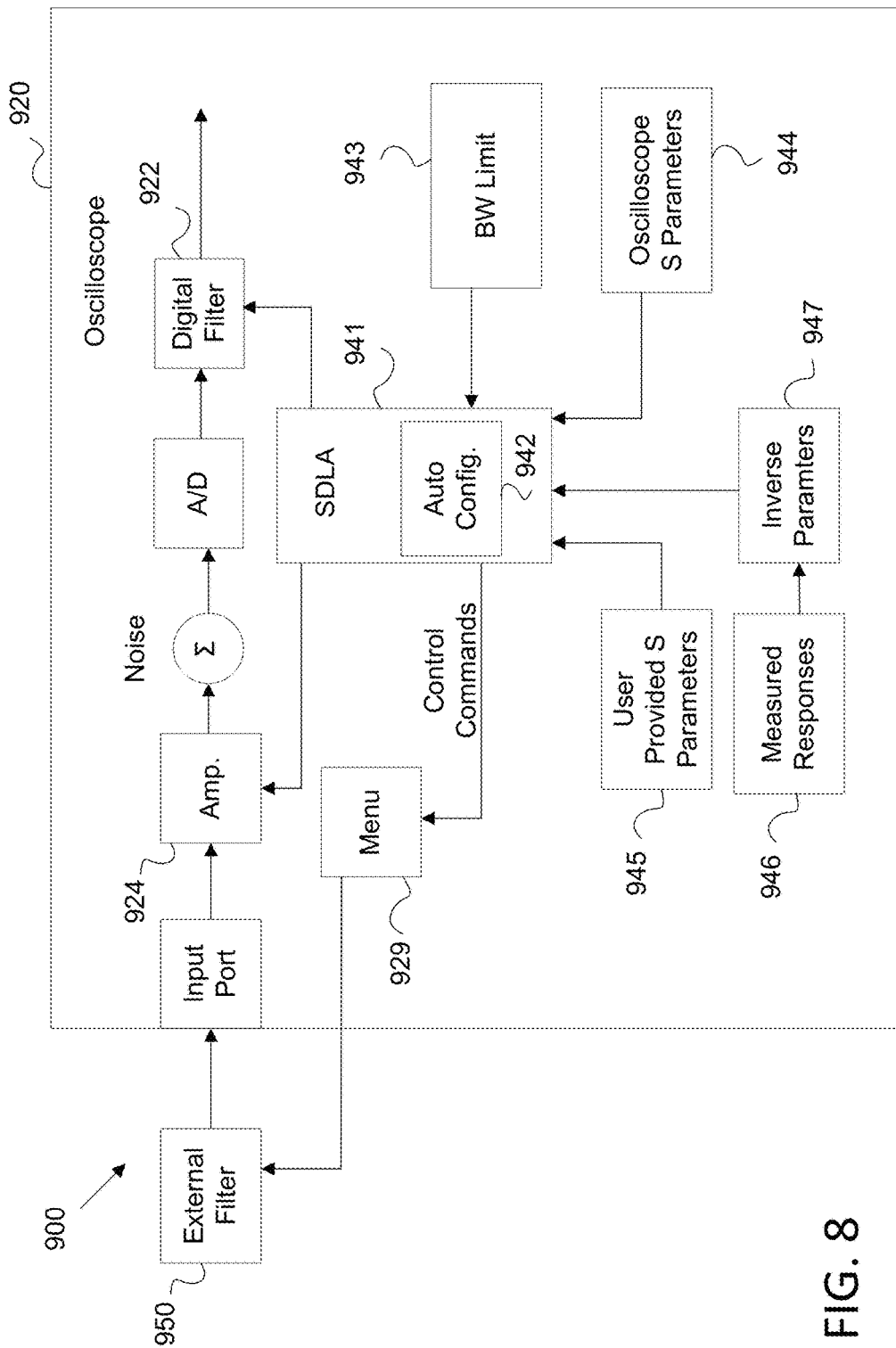
FIG. 8 is a functional depiction of a test and measurement system, in accordance with various embodiments of the present disclosure.

FIG. 8 is a functional illustration of an example of a test and measurement system 900 including an oscilloscope 920 configured to control an external filter 950 via SDLA 941. System 900 is substantially similar to system 800, but is shown in terms of functional component interaction instead of specific hardware. Further, system 900 is functionally similar to system 500, but is adapted to control an external filter 950 instead of internal analog filter 521. External filter 950 is substantially similar to external filters 750 and 850. Oscilloscope 920 includes menu 929, filter 922, SDLA component 941, auto configure 942 component, and inputs BW limit 943, oscilloscope S-parameters 944, user provided S-parameters 945, measured responses 946, and inverse parameters 947, which are substantially similar to menu 529, filter 522, SDLA component 541, auto configuration 542 component, BW limit 543, oscilloscope S-parameters 544, user provided S-parameters 545, measured responses 546, and inverse parameters 547, respectively. Unlike system 500, the measured responses 946 may also include S-parameters for the external filter 950 that are stored in the external filter 950 and received via an interface between a controller on the external filter 950 and a controller on the oscilloscope 920. The SDLA 941 then generates control commands (e.g., PI commands) to be transmitted to the menu 929 and/or the external filter 950 based on the S-parameters from the external filter 950 and the oscilloscope S-parameters 944. Further, the SDLA 941 employs the auto configure 942 component to iteratively adjust, as discussed elsewhere herein, the external filter 950 and/or the amplifier 924 gain/attenuation to increase, optimize, or nearly optimize the SNR of the signal received and sampled by the oscilloscope 920.

Figure 9:
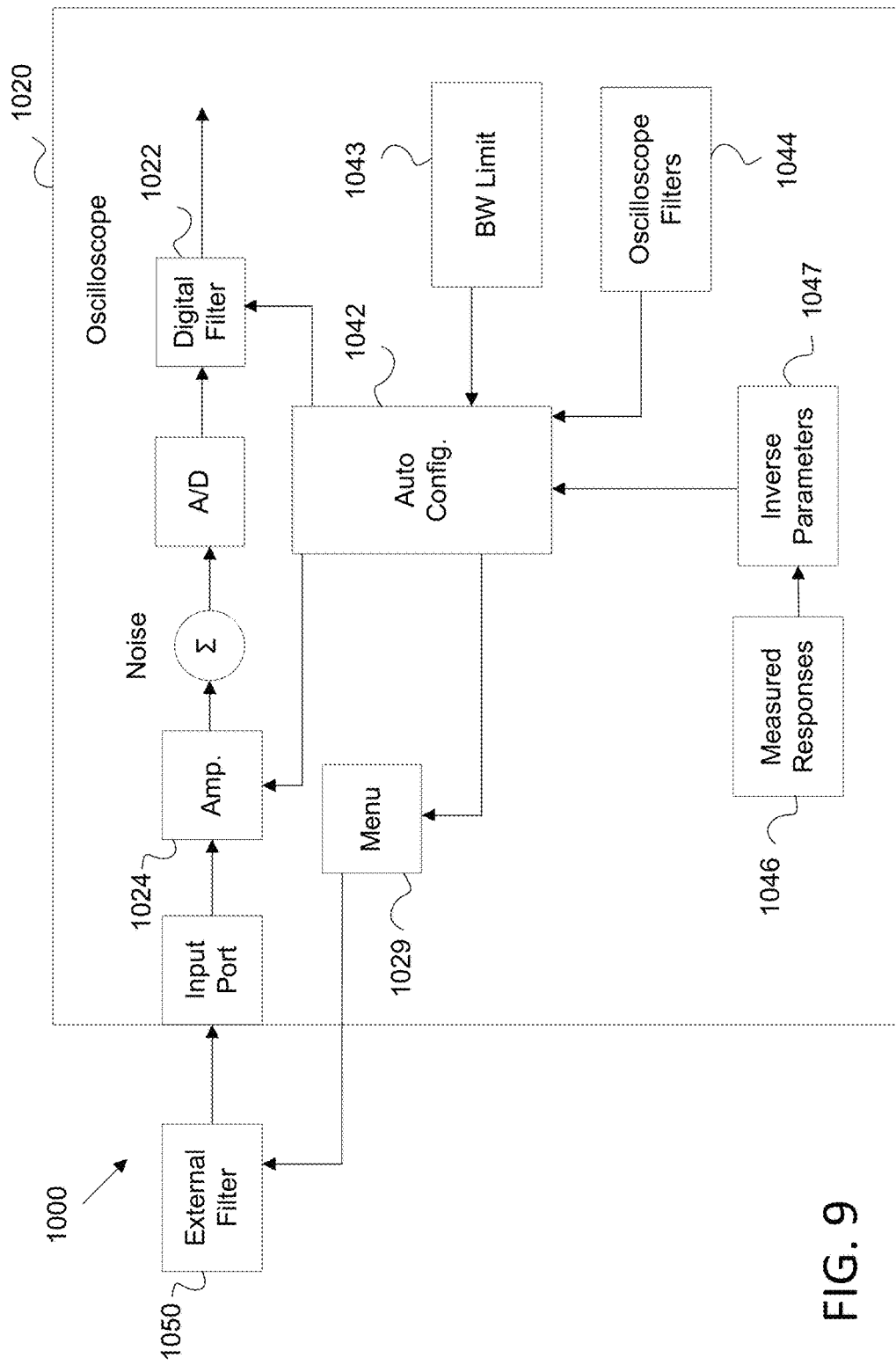
FIG. 9 is another functional depiction a test and measurement system, in accordance with various embodiments of the present disclosure.

FIG. 9 is a functional illustration of an example of a test and measurement system 1000 including an oscilloscope 1020 configured to control an external External filter 1050 without SDLA. System 1000 is substantially similar to system 900, but is implemented without SDLA, S-parameters, or control commands. External filter 1050 is substantially similar to external filter 750. Oscilloscope 1020, menu 1029, filter 1022, BW limit 1043, measured responses 1046, and inverse parameters 1047 are substantially similar to oscilloscope 920, menu 929, filter 922, BW limit 943, measured responses 946, and inverse parameters 947, respectively. Auto configure 1042 component is substantially similar to auto configure 942 component, but is implemented without SDLA. Accordingly, auto configure 1042 component adjusts/controls the external filter 1050 and/or digital filter 1022 directly without employing S-parameters for de-embedding. Specifically, the auto configure 1042 component can iteratively adjust external filter 1050 and/or the amp to optimize the SNR of the digital signal based on the measured responses 1046 based on user instructions received from menu 1029. The auto configure 1042 component can also calculate inverse parameters 1047 from the measured responses 1046 and employ the inverse parameters 1047 to adjust digital filter 1022 into an inverse frequency shape of external filter 1050 and/or amplifier 1024. The auto configure 1042 can also consider the BW limit 1043 of the oscilloscope 1020 as well as any other oscilloscope filters 1044 to be applied to the signal when setting parameters for digital filter 1022. As such, the auto configure 1042 component, can be configured to iteratively and continuously control the external filter 1050 and/or an inverse filter implemented via digital filter 1022 to amplify a signal prior to the introduction of downstream oscilloscope channel noise as needed based on user commands. Further, auto configure 1042 component can also be employed to implement any of the methods disclosed herein, such as methods 1600 and/or 1700.

Figure 10:
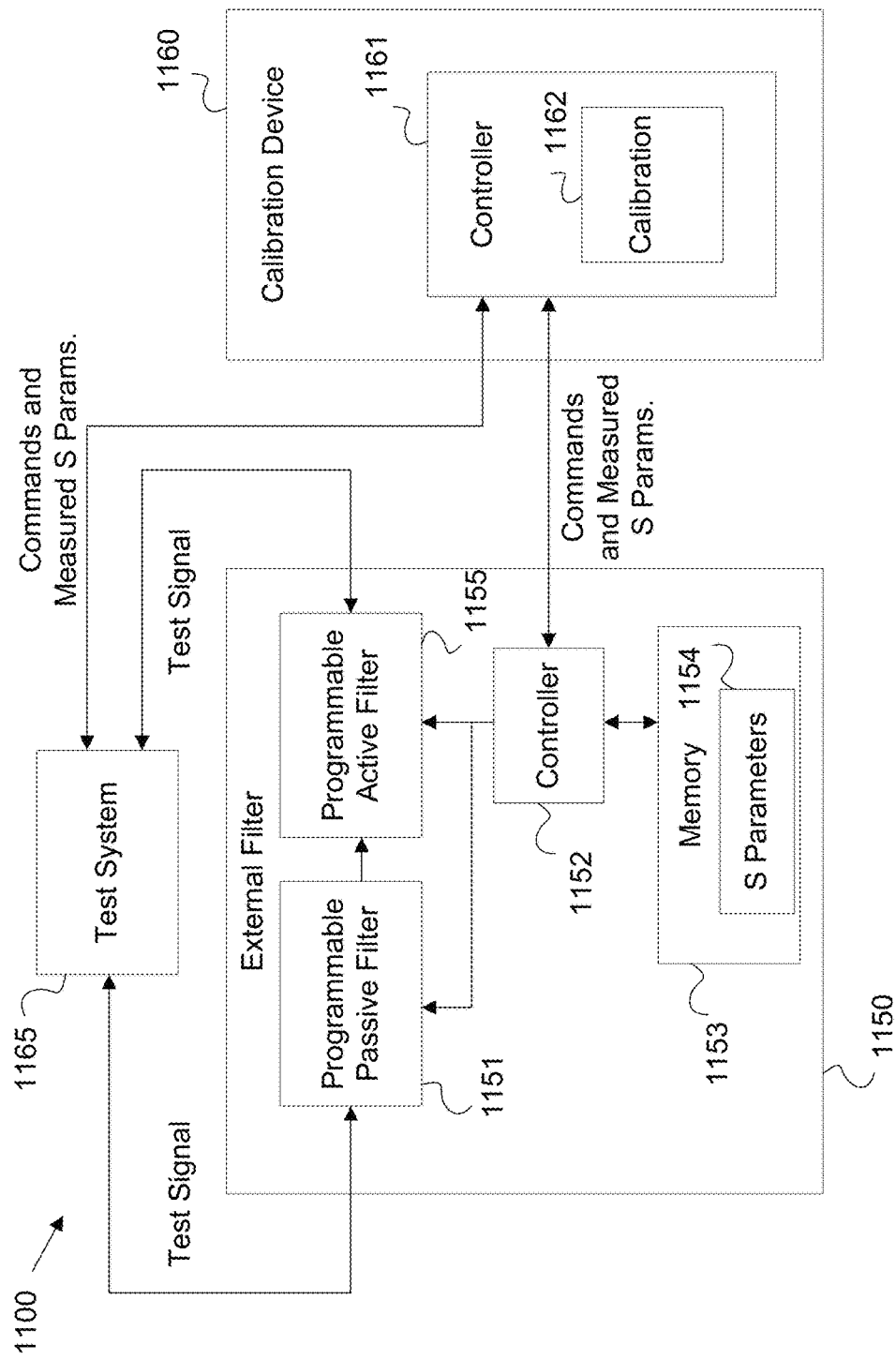
FIG. 10 depicts a block diagram of a test and measurement system, in accordance with various embodiments of the present disclosure.

FIG. 10 is a block diagram of an example of a test and measurement system 1100 configured to calibrate an external filter 1150. External filter 1150 is substantially similar to external filter 750. External filter 1150 contains a programmable passive filter 1151, a programmable active filter 1155, a controller 1152, a memory 1153, and S-parameters 1154, which are substantially similar to programmable passive filter 751, programmable active filter 755, controller 752, memory 753, and S-parameters 754 specific, respectively.

External filter 1150 is coupled to a test system 1165 for calibration. The test system may include a vector network analyzer (VNA) or a time domain reflection (TDR)/time domain transmission (TDT) test instrument. The test system 1165 is coupled to both the input and output ports of the external filter 1150. A test signal is transmitted across the filters 1151 and 1155 and captured by the test system 1165. The test system 1165 then measures the S-parameters associated with the external filter 1150.

A calibration device 1160 is also employed. Calibration device 1160 may be any component configured to control the external filter 1150 for testing purposes. For example, the calibration device may be a general purpose computer, an oscilloscope, a special purpose test system, etc. The calibration device includes a controller 1161, which may include a processor, memory, etc. The controller 1161 includes a calibration component 1162 configured to control the external filter 1150 during the calibration process. The S-parameters measured by the test system 1165 and/or any associated commands are forwarded from the test system 1165 to the calibration device 1160. The calibration device 1160 then forwards the measured S-parameters to the external filter 1150, via controller 1161, for storage in S-parameters 1154. Test system 1165 and calibration device 1160 may also interact to change the frequency response of filters 1151 and 1155 during testing to obtain any changes in S-parameters resulting from different configurations. Any changes in S-parameters resulting from different configurations may also be measured by the test system 1165 and stored in memory 1153 based on commands from the calibration device 1160. Such S-parameters can be correlated with the associated different configurations of filters 1151 and 1155 in memory 1153 to enable retrieval of S-parameters based on a specified configuration of filters 1151 and 1155. It will be appreciated that these different configurations can include individual use of filter 1151 or 1155, or combined use of filter 1151 and 1155, as described in reference to FIG. 7, above.

Figure 11:
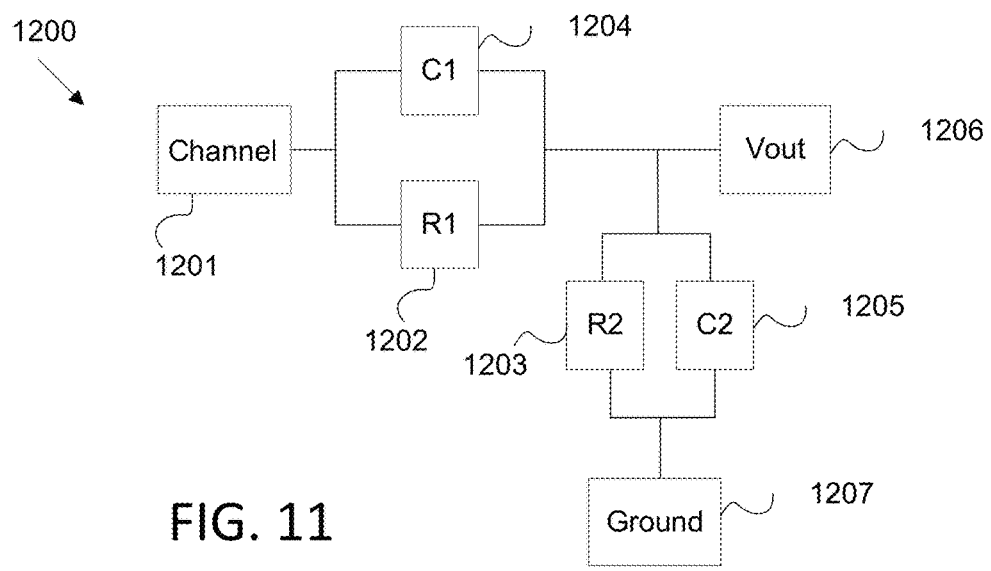
FIG. 11 depicts a block diagram of passive analog filter, in accordance with various embodiments of the present disclosure.

FIG. 11 is a block diagram of an example of a resistor (R) and capacitor (C) based passive filter 1200, which can be employed to implement any passive filter disclosed herein, such as filters 121, 321, 421, 521, 621, 751, 850, 950, 1050, and/or 1151, respectively. It should be noted that a passive filter, such as filter 1200, can implement high-pass transfer functions to compensate for channel loss. A passive structure can cancel both precursor and long-tail interspike intervals (ISI) resulting from the channel response. A passive structure, such as filter 1200, can be purely passive or combined with an amplifier to provide gain. A passive structure can be useful in high-frequency applications. A passive filter can also be beneficial in situations where the oscilloscope channel already includes too much native direct current (DC) gain for an associated use (e.g., amplification of the signal).

Figure 12:
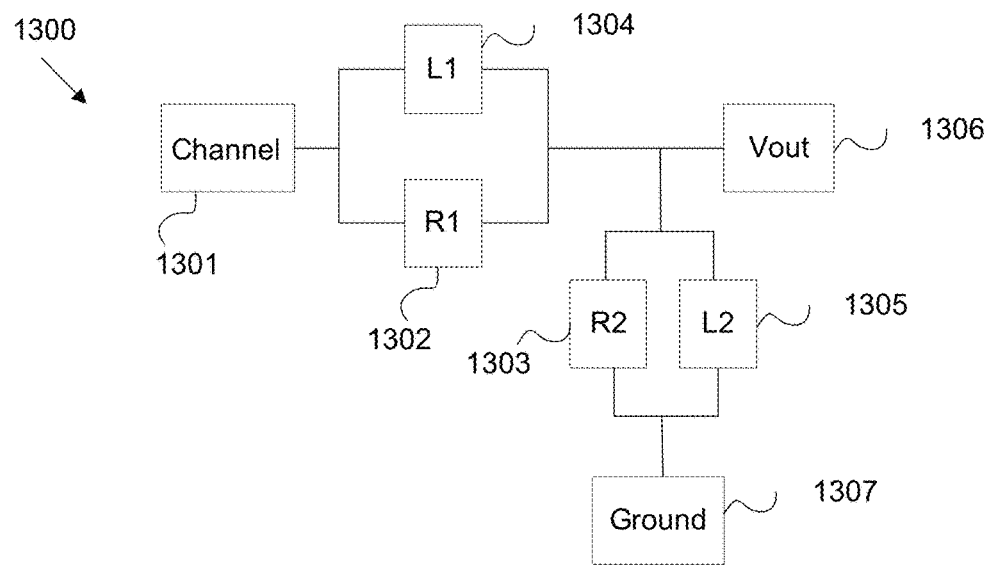
FIG. 12 depicts another a block diagram of a passive analog filter, in accordance with various embodiments of the present disclosure.

Passive filter 1200 is coupled to a channel 1201. Channel 1201 is an oscilloscope or external channel configured to conduct an analog signal received, for example, from a DUT link. Passive filter 1200 includes adjustable capacitor C1 1204 and adjustable resistor R1 1202 connected in parallel and connected to channel 1201 as shown in FIG. 12. Passive filter 1200 further includes adjustable capacitor C2 1205 and adjustable resistor R2 1203 connected in parallel and further connected to a ground 1207 as shown. C1 1204, C2 1205, R1 1202, and R2 1203 are coupled to a voltage output (Vout) 1206 as shown, to conduct the analog signal from channel 1201 to Vout 1206 for transmission to other components outside of the filter 1200. Passive filter 1200 scales, or adjusts, the low frequencies of the analog signal traversing channel 1201 to Vout 1206 relative to the high frequencies. Passive filter 1200 is passive because no voltage amplification is employed. Hence, the low frequencies are reduced without reducing the high frequencies to provide for the scaling. Passive filter 1200 can be adjusted to create different frequency responses (e.g. select the bounds of high frequencies, low frequencies, scaling factor, etc.) by adjusting C1 1204, C2 1205, R1 1202, and R2 1203 to selected capacitance and resistance values, respectively. The electrical response of passive filter 1200 can be described mathematically by equations 1-4 below:

$$H(s) = \frac{R_2}{R_1 + R_2} \cdot \frac{1 + sR_1C_1}{1 + \left(\frac{R_2R_1}{R_2 + R_1}\right)(C_1 + C_2)s} \quad \text{Equation 1}$$

where H(s) is the transfer function of the passive filter, R1 and R2 are the resistances of R1 1202 and R2 1203, respectively, C1 and C2 are the capacitances of C1 1204 and C2 1205, respectively, and s is a complex frequency of the signal;

$$DC\ Gain = \frac{R_2}{R_1 + R_2} \quad \text{Equation 2}$$

where DC Gain is the low frequency voltage gain of the signal traversing the passive filter 1200 and all other variables are as described in equation 1;

$$HF\ Gain = \frac{C_1}{C_1 + C_2} \quad \text{Equation 3}$$

where HF gain is the high frequency voltage gain of the signal traversing the passive filter 1200 and all other variables are as described in equation 1; and $$Peaking = \frac{HF\ Gain}{DC\ Gain} = \frac{R_1 + R_2}{R_2} \cdot \frac{C_1}{C_1 + C_2} \quad \text{Equation 4}$$

where Peaking is the scale of the high frequency voltage gain to low frequency voltage gain of the signal traversing the passive filter 1200 and all other variables are as described in equations 1-3.

FIG. 12 is a block diagram of an example of an R and inductor (L) based passive filter 1300. Passive filter 1300 is substantially similar to passive filter 1200, but is instead implemented with inductors. Passive filter 1300 can be employed to implement any passive filter disclosed herein, such as filters 121, 321, 421, 521, 621, 751, 850, 950, 1050, and/or 1151, respectively. Passive filters 1300 includes channel 1301, R1 1302, R2 1303, Vout 1306, and ground 1307, which are substantially similar to channel 1201, R1 1202, R2 1203, Vout 1206, and ground 1207, respectively. Passive filter 1300 also includes adjustable inductors L1 1304 and L2 1305 instead of capacitors 1204 and 1205, respectively. Passive filter 1300 scales the low frequencies of the analog signal traversing channel 1301 relative to the high frequencies in a manner similar to passive filter 1200. Passive filter 1300 can be adjusted to create different frequency responses (e.g. select the bounds of high frequencies, low frequencies, scaling factor, etc.) by adjusting L1 1304, L2 1305, R1 1302, and R2 1303 to selected inductance and resistance values, respectively. The electrical response of passive filter 1300 can be described mathematically by equations 5-8 below:

$$H(s) = \frac{R_2\left(s + \frac{R_1}{L_1}\right)}{R_2\left(s + \frac{R_1}{L_1}\right) + R_1\left(s + \frac{R_2}{L_2}\right)} \quad \text{Equation 5}$$

$$DC\ Gain = \frac{L_2}{L_1 + L_2} \quad \text{Equation 6}$$

$$HF\ Gain = \frac{R_2}{R_1 + R_2} \quad \text{Equation 7}$$

$$Peaking = \frac{HF\ Gain}{DC\ Gain} = \frac{R_2}{R_1 + R_2} \cdot \frac{L_1 + L_2}{L_2} \quad \text{Equation 8}$$

where all variables are as described in equations 1-4 as applied to passive filter 1300 except L1 and L2 are the inductances of L1 1304 and L2 1305, and R1 and R2 are the resistances of R1 1302 and R2 1303, respectively.

It will be appreciated that multiple configurations of the passive filters described herein, could be implemented into a single instance. In such an instance, the passive filters (variable and/or static) can be coupled with a switching network that can select which passive filter, or filters, to apply to an incoming signal. In embodiments, the passive filter, or filters, to be applied can be selected by the previously discussed controller. Variable passive filters can include those passive filters described above and can also include varactors, field effects transistors (FETs), etc.

Figure 13:
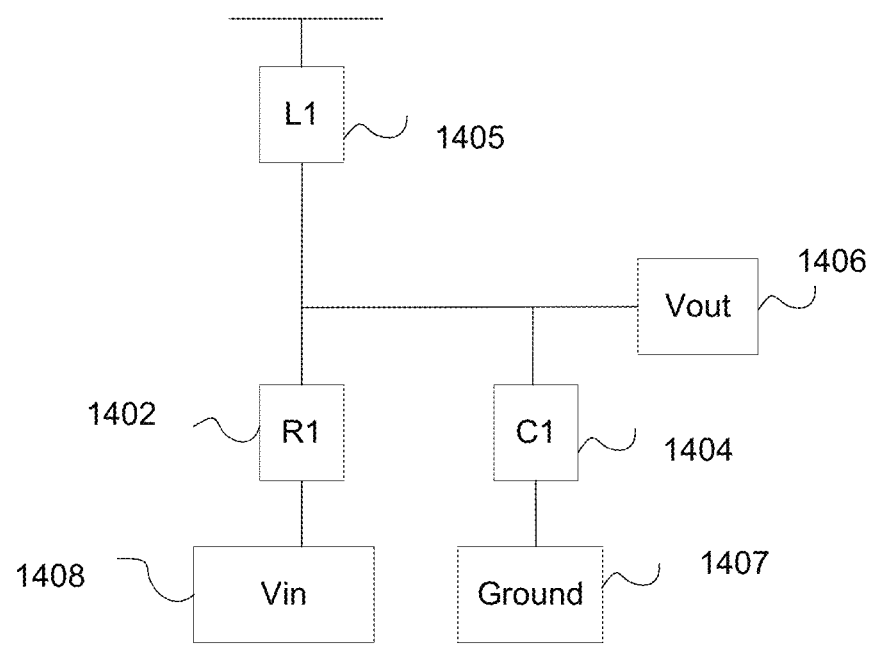
FIG. 13 depicts a block diagram of an active analog filter, in accordance with various embodiments of the present disclosure.

FIG. 13 is a block diagram of an example of an RL based active filter 1400, which can be employed to implement any active filter disclosed herein, such as filters 121, 321, 421, 521, 621, 755, 850, 950, 1050, and/or 1155, respectively.

Figure 14:
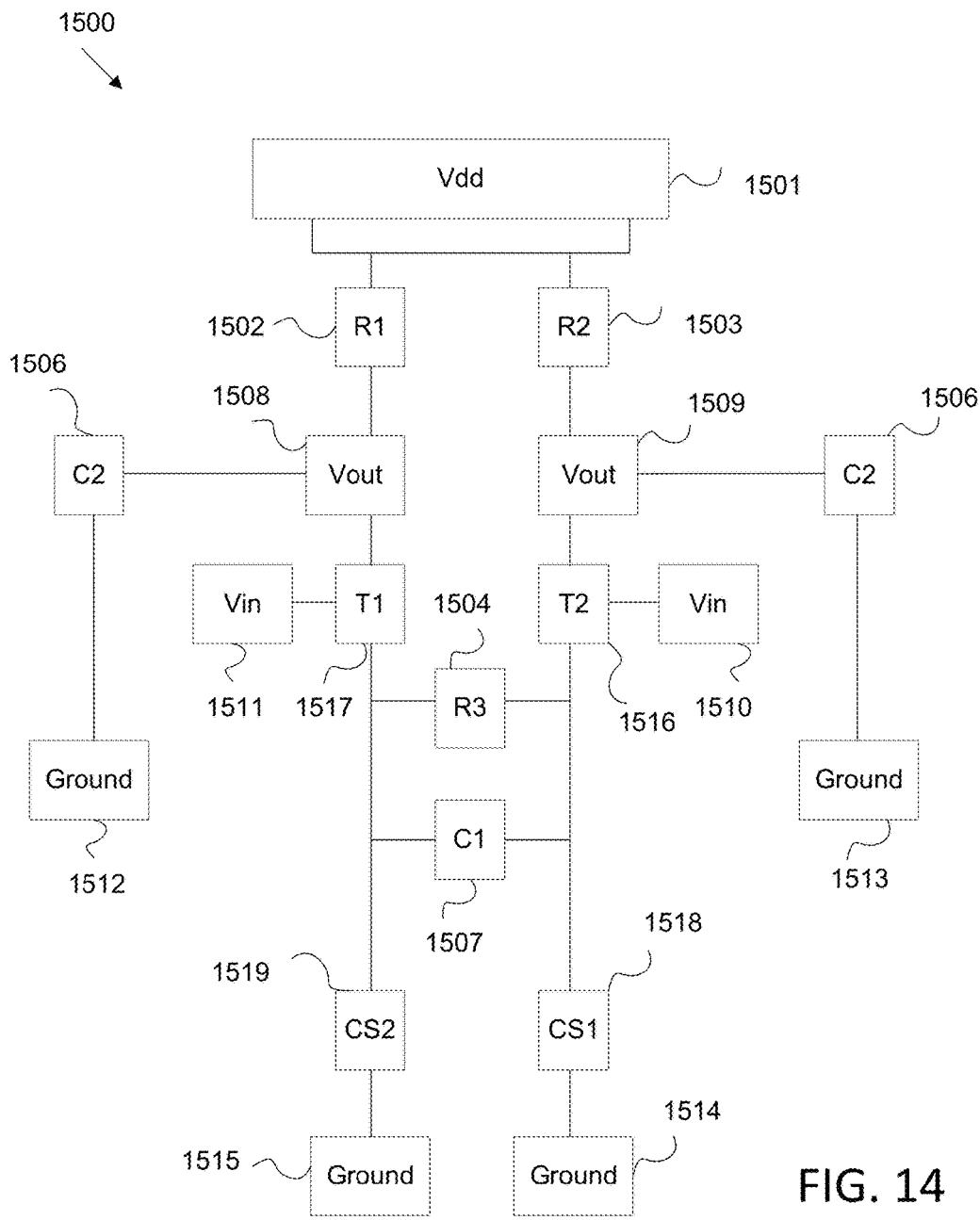
FIG. 14 depicts another block diagram of an active analog filter, in accordance with various embodiments of the present disclosure.

Unlike passive filters 1200 and 1300, active filter 1400 provides amplification, and hence scales the high frequencies of the analog signal relative to the low frequencies by boosting the high frequencies. Active filter 1400 includes adjustable inductor L1 1405, adjustable resistor R1 1402, adjustable capacitor C1 1404, Vout 1406, ground 1407, and Vin 1408, which are connected as shown in FIG. 14. Vin 1408 is an incoming voltage and may be received, for example, via a transistor such as a metal-oxide-semiconductor field-effect transistor (MOSFET) or a bipolar junction transistor (BJT). The Vin 1408 may be connected to the channel and hence the channel can conduct the analog signal toward Vout 1406. The inductor L1 1405 can act as a complex underdamped pole to provide a boost for higher frequencies without boosting the lower frequencies. Active filter 1400 can be adjusted to create different frequency responses (e.g. select the bounds of high frequencies, low frequencies, scaling factor, etc.) by adjusting L1 1405, R1 1402, and C1 1404 to selected inductance, resistance, and capacitance values, respectively. The electrical response of active filter 1400 can be described mathematically by equations 9-13 below:

$$H(s) = \frac{k(s + \omega_1)}{s^2 + \frac{\omega_2}{Q}s + (\omega_2)^2} \quad \text{Equation 9}$$

$$\omega_1 = \frac{R_1}{L_1} \quad \text{Equation 10}$$

$$\omega_2 = \frac{1}{\sqrt{L_1 C_1}} \quad \text{Equation 11}$$

$$Q = \frac{1}{R_1}\sqrt{\frac{L_1}{C_1}} \quad \text{Equation 12}$$

$$\text{Peaking} = \frac{HF \text{ Gain}}{DC \text{ Gain}} = \frac{\omega_2}{\omega_1} \quad \text{Equation 13}$$

where H(s) is the transfer function of the active filter 1400, R1 is the resistance of R1 1402, C1 is the capacitance of C1 1404, L1 is the inductance of L1 1405, s is a complex frequency of the signal, $\omega_1$ and $\omega_2$ indicate $2\pi$ times the signal frequency at low and high frequencies, respectively, Q is a quality factor describing the under-damping of the circuits resonance, HF gain and DC gain are the high and low frequency gains, respectively, and Peaking is the scale of the high frequency voltage gain to low frequency voltage gain of the signal traversing the active filter 1400.

FIG. 14 is a block diagram of an example of a transistor based active filter 1500, which is similar to active filter 1400 and can be employed to implement any active filter disclosed herein, such as filters 121, 321, 421, 521, 621, 755, 850, 950, 1050, and/or 1155, respectively. As with active filter 1400, active filter 1500 provides amplification, and hence scales the high frequencies of the analog signal relative to the low frequencies by boosting the high frequencies. Active filter 1500 provides a peaking boost with an RC degenerated differential pair. In this topology, the gain, boost, and bandwidth may be limited by the frequency of the transistors in the circuit. Active filter 1500 includes Vdd 1501, which is driving voltage (e.g. from a power supply). Active filter 1500 further includes Vin 1511 and Vin 1510, which accept the analog signal from the DUT link. Active filter 1500 further includes Vout 1508 and 1509, which output the scaled analog signal toward components downstream from the active filter 1500. Active filter 1500 further includes R1 1502, R2 1503, and R3 1504, which are adjustable resistors with adjustable resistances. Active filter 1500 further includes C1 1507 and C2 1506, which are adjustable capacitors with adjustable capacitances. Active filter 1500 further includes T1 1517 and T2 1516, which are transistors, such as MOSFETs and/or BJTs. Active filter 1500 further includes CS1 1518 and CS2 1519, which are current sources. Active filter 1500 further includes grounds 1512, 1513, 1515, and 1514. The components of active filter 1500 are connected as shown in FIG. 15. The analog signal traverses active filter 1500 from Vin 1510-1511 toward Vout 1508-1509 while being modified by the other circuit components by boosting the selected high frequencies without boosting the selected low frequencies. Active filter 1500 can be adjusted to create different frequency responses (e.g. select the bounds of high frequencies, low frequencies, scaling factor, etc.) by adjusting C1 1507 and C2 1506, to selected capacitance values and adjusting R1 1502, R2 1503, and R3 1504 to selected resistance values, respectively. The electrical response of active filter 1500 can be described mathematically by equations 14-17 below:

$$\omega_{z1} = \frac{1}{R_3 C_1} \quad \text{Equation 14}$$

$$\omega_{p1} = \frac{1}{R_2 C_2} \quad \text{Equation 15}$$

$$\omega_{p2} = \frac{1 + (g_m + g_{mb})R_3/2}{R_3 C_1} \quad \text{Equation 16}$$

$$\text{Peaking} = \frac{HF \text{ Gain}}{DC \text{ Gain}} = \frac{\omega_{p2}}{\omega_{z1}} \cong 1 + g_m R_3/2 \quad \text{Equation 17}$$

where $\omega_{z1}$, $\omega_{p1}$, and $\omega_{p2}$ indicate $2\pi$ times the signal frequency at selected frequencies, R2 and R3 are the selected resistances associated with R1 1502, R2 1503, and R3 1504, C1 and C2 are the selected capacitances associated with C1 1507 and C2 1506, $g_m$ and $g_{mb}$ are transconductance values associated with the transistors, HF gain and DC gain are the high and low frequency gains, respectively, and Peaking is the scale of the high frequency voltage gain to low frequency voltage gain of the signal traversing the active filter 1500.

FIG. 15 is a block diagram of an example of a method 1600 of controlling a filter, such as filters 121, 221, 321, 421, 521, 621, 751, 755, 850, 950, 1050, 1151, 1155, 1200, 1300, 1400, 1500, and/or combinations thereof, to increase the SNR of a signal. Method 1600 may be employed by a processor and/or controller, such as controller 440, 740, 840, and/or 1161. Further, method 1600 may be implemented, in full or in part, based on receiving user commands and/or S-parameters via user controls and/or receiving such commands/parameters from system memory. At block 1601 an analog signal is iteratively received, converted to a digital signal, and a scale of selected high frequencies with respect to selected low frequencies is increased. The analog signal can be received from, for example, a device under test (DUT). In some embodiments, the analog signal may be received via a DUT link that is negatively affected by frequency specific attenuation, such as DUT link 113, 413, and/or any other DUT link discussed herein. The conversion of the analog signal to a digital signal can be performed by an A/D converter, such as A/D converter 125, 225, 325, 425, 721, 821, and/or any other A/D converter discussed herein.

The scale of the selected high frequencies of the analog signal is then increased relative to the selected low frequencies of the analog signal utilizing an analog filter. As discussed above, if the analog filter is an active filter, the scale is increased by adjustably amplifying the selected high frequencies. If the analog filter is a passive filter, the scale is increased by attenuating the selected low frequencies. The high frequencies and low frequencies may be selected by a user via user controls automatically, as discussed above, via stored and/or received S-parameters, etc. The scale is iteratively increased to increase the SNR of the converted digital signal in the digital domain. In embodiments where the analog signal is received via a DUT link that is negatively affected by frequency specific attenuation, adjusting the scale of the high frequencies relative to the low frequencies can include adjusting for the frequency specific attenuation occurring in the DUT link. In an example, the scale provided by the analog filter is iteratively increased until a maximum amplitude of the digital signal meets or exceeds a conversion capacity of the A/D converter. When the conversion capacity of the A/D converter is exceeded, clipping results. Clipping describes a situation where the maximum amplitude of the analog signal exceeds the maximum output of the A/D converter, resulting in the amplitude of the digital signal being reduced/clipped down to the maximum output of the A/D converter. Clipping is a conversion error, is undesirable, and indicates that the scaling has increased beyond the hardware's capacity and should be reduced.

The method 1600 then proceeds to block 1603 and reduces the scaling provided by the analog filter until no clipping occurs. In some examples, maintaining a specified margin between the maximum amplitude of the analog signal and the conversion capacity of the A/D converter is desirable to prevent unforeseen clipping. In such cases, the scale provided by the analog filter is further reduced to maintain the specified margin (e.g., 20% below the maximum output of the A/D converter). The margin may be specified in oscilloscope memory and/or received from a user via user controls.

It should be noted that, in some examples, where the conversion capacity of the A/D converter is known, the scaling of the analog filter may be iteratively increased only until the amplitude of the analog signal meets the conversion capacity of the A/D converter at block 1601. In other examples, the scaling of the analog filter may be iteratively increased only until the amplitude of the analog signal meets the conversion capacity of the A/D converter minus the specified margin at block 1601. In either case, block 1603 may not be employed, as a maximum SNR has been achieved without causing clipping, and reducing the scaling of the analog filter may not be needed. It will be appreciated that the digital signal resulting from method 1600 can then be filtered by a digital filter having a frequency response shape that is an inverse of the analog filter. By scaling the signal in the analog domain, the signal is scaled, or increased, relative to noise introduced in the signal channel (e.g., by an A/D converter). Subsequent filtering by the digital filter can reverse this scaling thus reducing the signal back to an original level, while reducing the noise introduced after the scaling in a corresponding amount.

Figure 16:
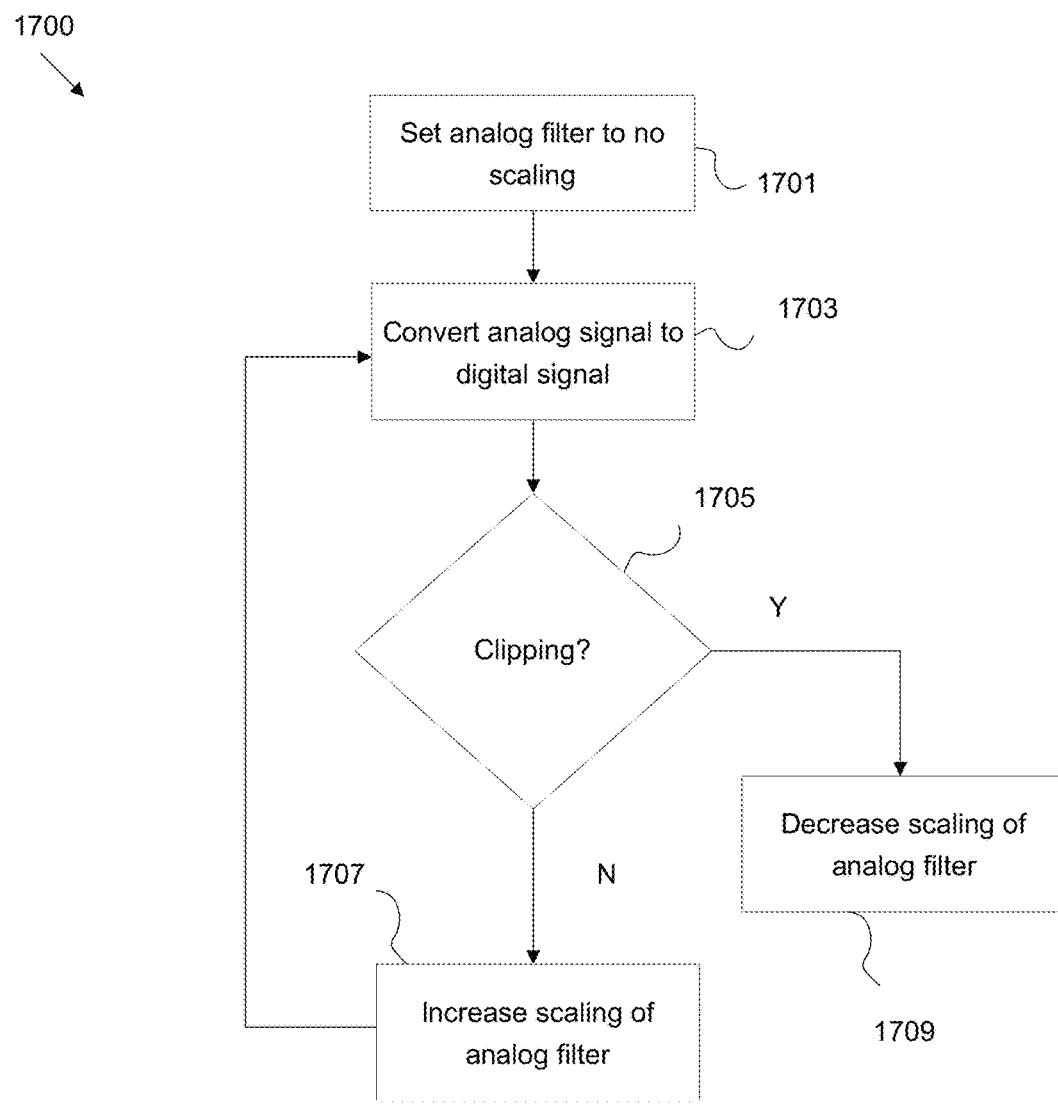
FIG. 16 depicts another method of controlling an analog filter, in accordance with various embodiments of the present disclosure.

FIG. 16 is a block diagram of another example of a method 1700 of controlling an analog filter, such as analog filters 121, 221, 421, 521, 621, 751, 755, 850, 950, 1050, 1151, 1155, 1200, 1300, 1400, 1500, amplifiers 824, 924, 1024, and/or combinations thereof, to optimize a signal to noise ratio (SNR). Method 1700 is substantially similar to method 1600, but is presented to clearly illustrate the process of iteratively increasing the scale provided by the analog filter as described above with respect to block 1605. At block 1701, the analog filter can be set to an initial state with no scaling. In other words, the analog filter may provide no frequency specific amplification and no frequency specific attenuation in the initial state. At block 1703, a signal is acquired in the digital domain by converting the analog signal to a digital signal via an A/D converter. At block 1705, the method 1700 determines whether clipping has occurred to the acquired signal at an A/D converter. This can be accomplished, for example, by comparing the amplitude of the analog signal with that of the digital signal by a controller, such as that described above. If no clipping has occurred, the method 1700 proceeds to block 1707 and increases the scaling as additional amplification may be possible, and therefore additional SNR improvements may be achievable. The method 1700 then returns to block 1703 and acquires the signal with the increased scaling. If clipping has occurred at block 1705, the method 1700 proceeds to block 1709. If clipping has occurred, then the scaling has increased beyond the system's capabilities. Hence the scaling should be decreased to maintain increased SNR without resulting in clipping. Accordingly, at block 1709, the scaling is decreased to prevent clipping and/or maintain a specified margin between the signal and the conversion capabilities of the A/D converter.

Figure 17:
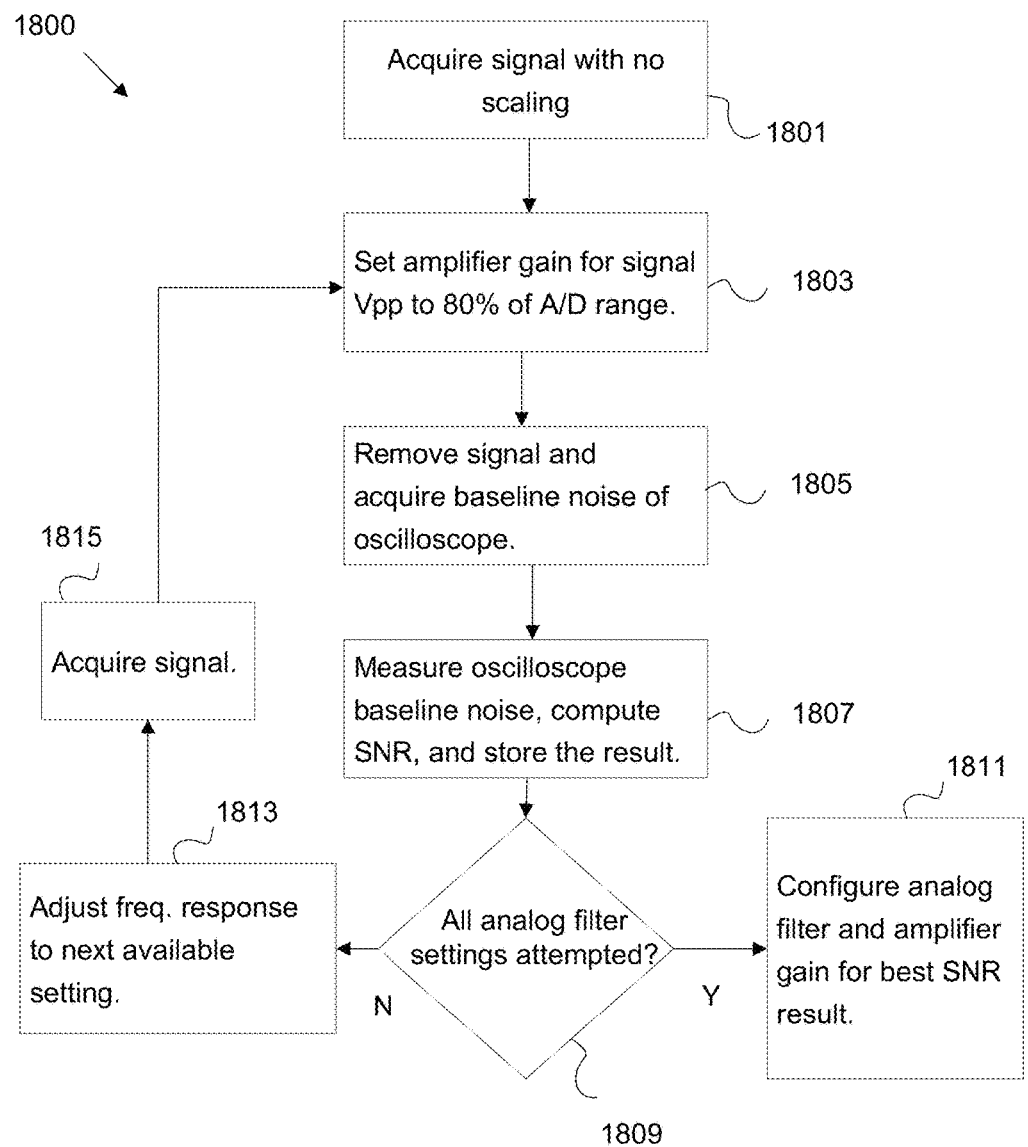
FIG. 17 depicts another method of controlling an analog filter, in accordance with various embodiments of the present disclosure.

FIG. 17 is a block diagram of an example of a method 1800 of controlling an analog filter, such as analog filters 121, 221, 321, 421, 521, 621, 751, 755, 850, 950, 1050, 1151, 1155, 1200, 1300, 1400, 1500, amplifiers 824, 924, 1024, and/or combinations thereof, by employing multiple parameters. Method 1800 is substantially similar to methods 1600 and 1700, and provides yet another mechanism to further optimize, or increase, SNR based on both available amplifier (e.g. amplifier 824) gain and available analog filter frequency responses. It should be noted that any oscilloscope or noise reduction device disclosed herein may be configured with an amplifier in the signal channel. Accordingly, method 1800 may be employed on any oscilloscope or noise reduction device disclosed herein.

At block 1801, an oscilloscope (e.g. oscilloscope 120, 420, 520, 620, 720, 820, 920, and/or 1020), or other noise reduction device (e.g., noise reduction device 220), acquires an incoming signal with no scaling. Examples with an external analog filter may control the external analog filter via an external software interface to set scaling, while examples with an internal analog filter may set the scaling via internal software commands. At step 1803, a signal gain of an amplifier along the signal channel is set. For example, the gain of the amplifier may be set to produce an output signal with a peak to peak voltage (Vpp) that is a specified percentage, or margin, of the range of the corresponding A/D, for example about eighty percent (%), although any other percentage, or margin, may be utilized.

At block 1805, the signal is removed, allowing the oscilloscope to acquire the baseline noise of the oscilloscope channel at the current analog filter and amplifier setting combination. At block 1807, the acquired oscilloscope baseline noise is measured and employed to compute the SNR of the signal. The SNR is then stored in conjunction with the CTLE and amplifier setting combination. At step 1809, the method 1800 determines whether each possible, or desired, analog filter setting has been attempted. If not, the method 1800 proceeds to iterate through all possible, or desirable, analog filter settings by proceeding to block 1813.

At block 1813, the frequency response of the analog filter is adjusted to the next available setting. At block 1815, the signal with the adjusted analog filter frequency response setting is acquired. The method 1800 then returns to block 1803 to determine the SNR of the signal at the newly selected analog filter frequency response setting. It should be noted that the amplifier gain value corresponding to the specified percentage may change based on the newly selected analog filter frequency response setting. Once the SNR has been determined for each possible analog filter setting, the method proceeds from block 1809 to block 1811. At block 1811, the analog filter and amplifier gain can be selected to provide highest (e.g. best or optimal) signal to noise ratio based on the values stored in step 1807.

Figure 18:
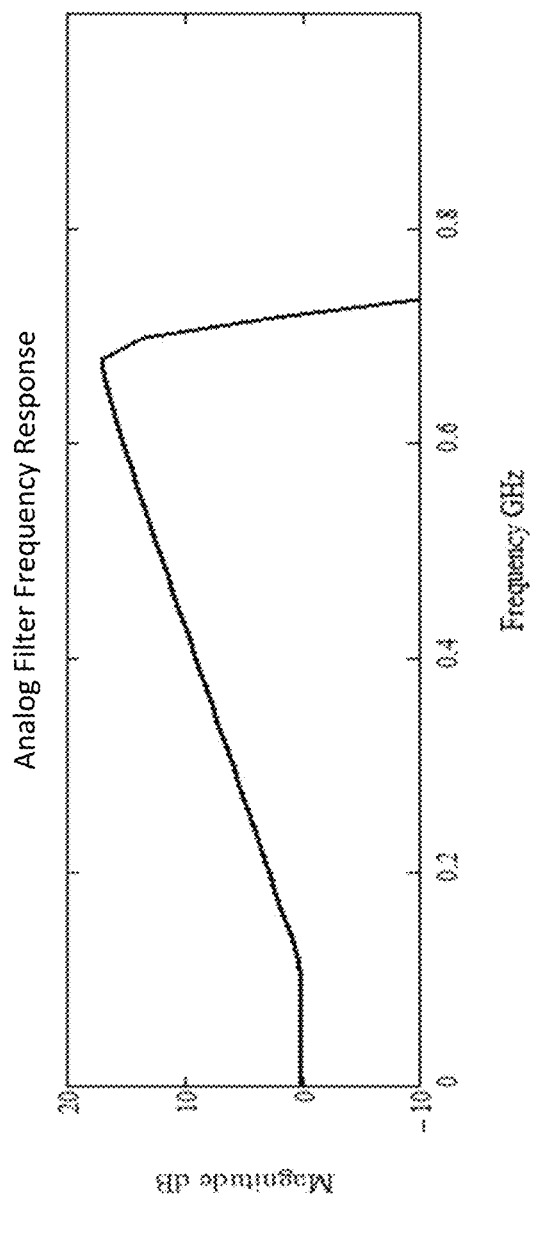
FIG. 18 depicts a graph of an example filter frequency response, in accordance with various embodiments of the present disclosure.

FIG. 18 is a graph 1900 of an example analog filter frequency response according to a disclosed example. Graph 1900 shows signal frequency in Gigahertz (GHz) along the horizontal axis and scaling (e.g. amplification) magnitude in the vertical axis in decibels (dB). As shown, no amplification is applied to the lower frequencies below about 0.1 GHz. Higher frequencies between about 0.1 GHz and about 0.7 GHz are increasingly boosted, or scaled, to overcome progressively higher attenuation at higher signal frequencies. Graph 1900 rolls off above about 0.7 GHz, meaning the analog filter filters out signals of frequencies higher than about 0.7 GHz. It should be noted that graph 1900 depicts a single frequency response which could be employed to implement any of the analog filters discussed herein. Graph 1900 is presented solely to provide an example of scaling high frequencies relative to low frequencies. As the analog filers disclosed herein are adjustable, substantially any frequency response can be obtained by adjusting the components of the analog filter (e.g. adjustable resistors, capacitors indicators, transistors, etc.) as needed. For example, a frequency response may be selected as an inverse of a response of a DUT link cable with a roll off characteristic as a function of frequency. It will be appreciated that the depicted frequency range is meant to be illustrative in nature and is not intended to be limiting of the possible frequency range of this disclosure. The frequency range for this disclosure can be any frequency range in which a device incorporating the teachings of this disclosure is configured to operate.

Figure 19:
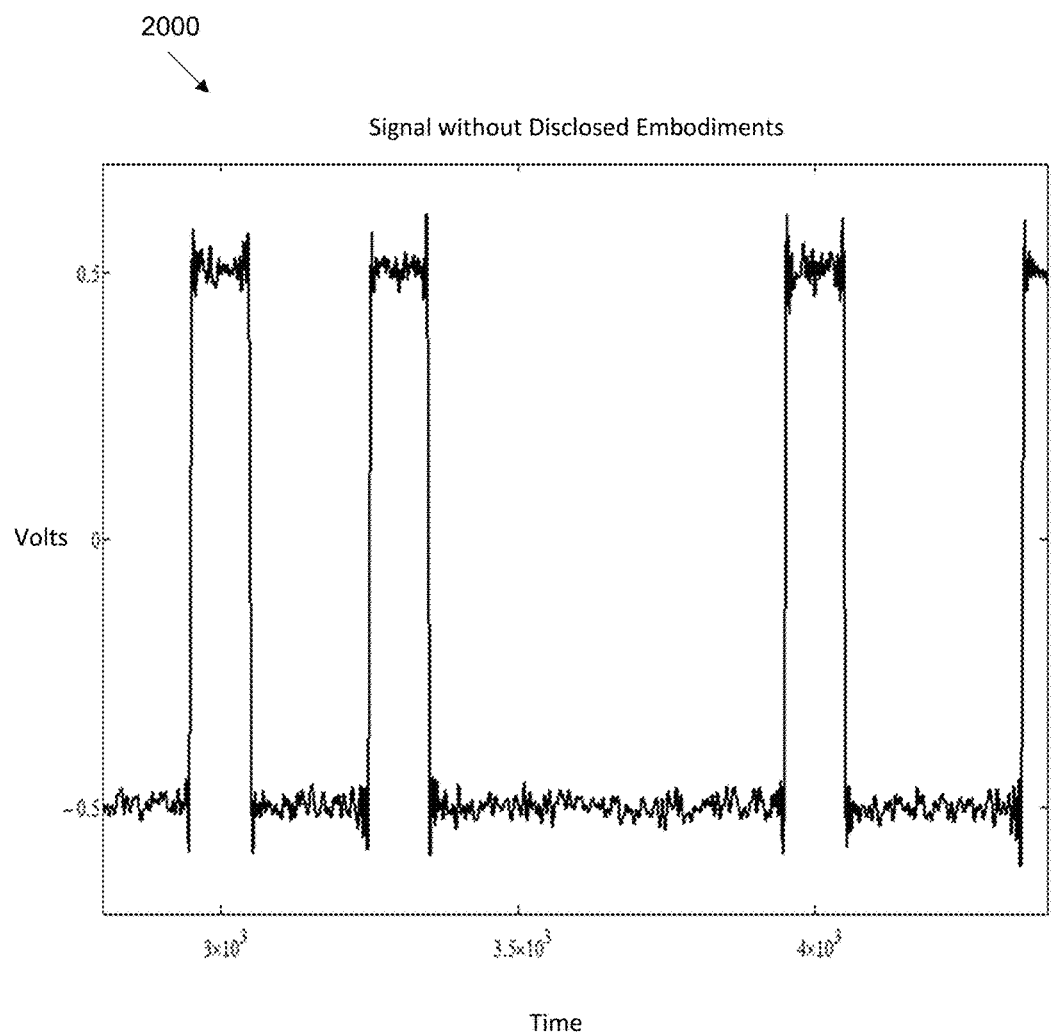
FIG. 19 depicts a graph of an example digital signal without the noise reduction mechanisms disclosed herein.

FIG. 19 is a graph 2000 of an example signal detected at an oscilloscope without the disclosed embodiments being applied. The input signal resulting in graph 2000 is a square wave, so all rough edges are the result of noise. The graph 2000 depicts amplitude in units of volts along the vertical axis and units of time along the horizontal axis. As shown, significant noise is detected both at the −0.5V low voltage and the 0.5V high voltage.

Figure 20:
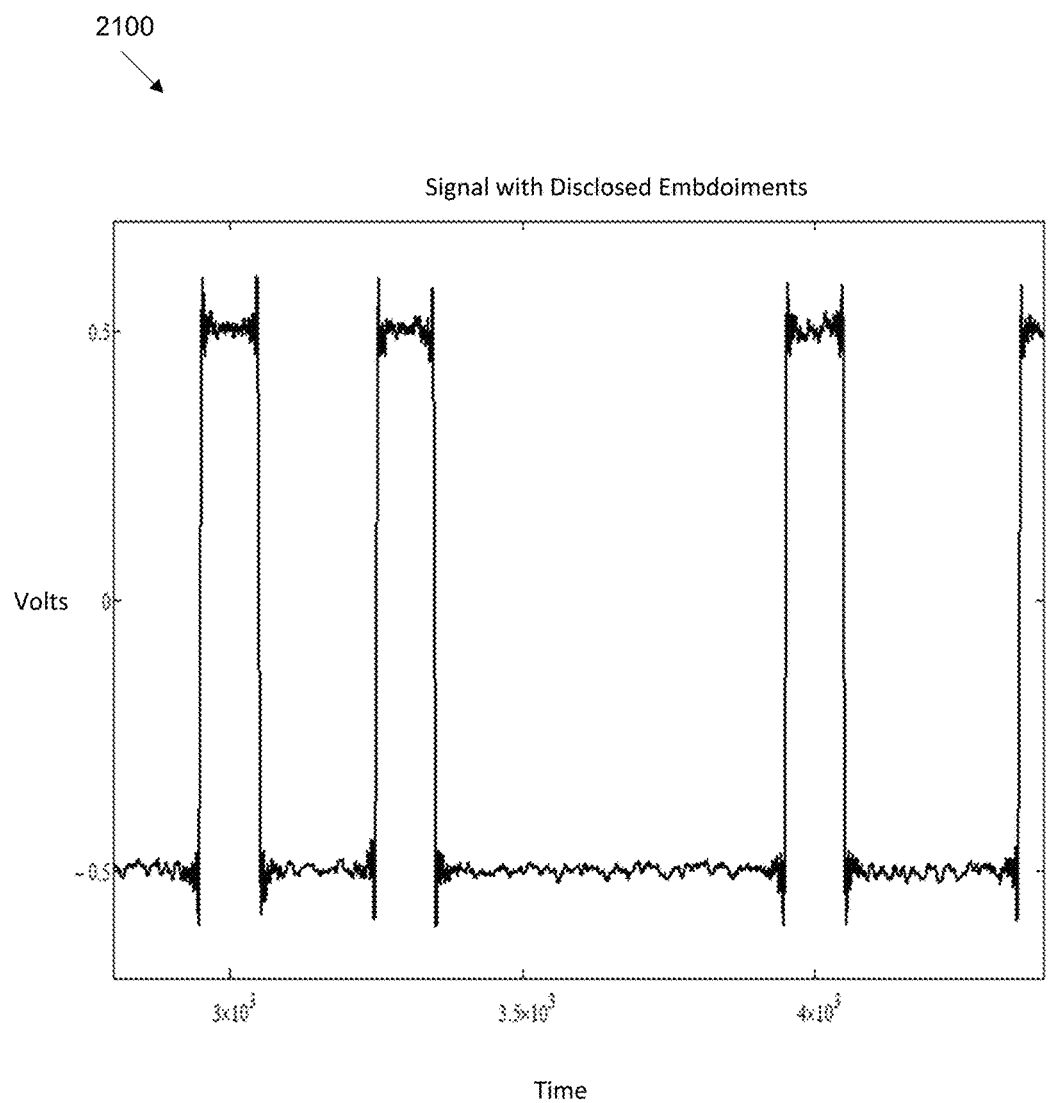
FIG. 20 depicts a graph of an example digital signal, in accordance with various embodiments of the present disclosure.

FIG. 20 is a graph 2100 of an example signal detected at an oscilloscope with disclosed embodiments applied, for example by employing any filter configuration disclosed herein. The graph 2100 depicts amplitude in units of volts along the vertical axis and units of time along the horizontal axis. By applying the filtering, signal noise at both the −0.5V low voltage and the 0.5V high voltage is decreased relative to the graph 2000. Accordingly, filtering as discussed herein significantly reduces signal noise detected at an oscilloscope. In the example shown, the filtering increases SNR by about 12 dB.

Figure 21:
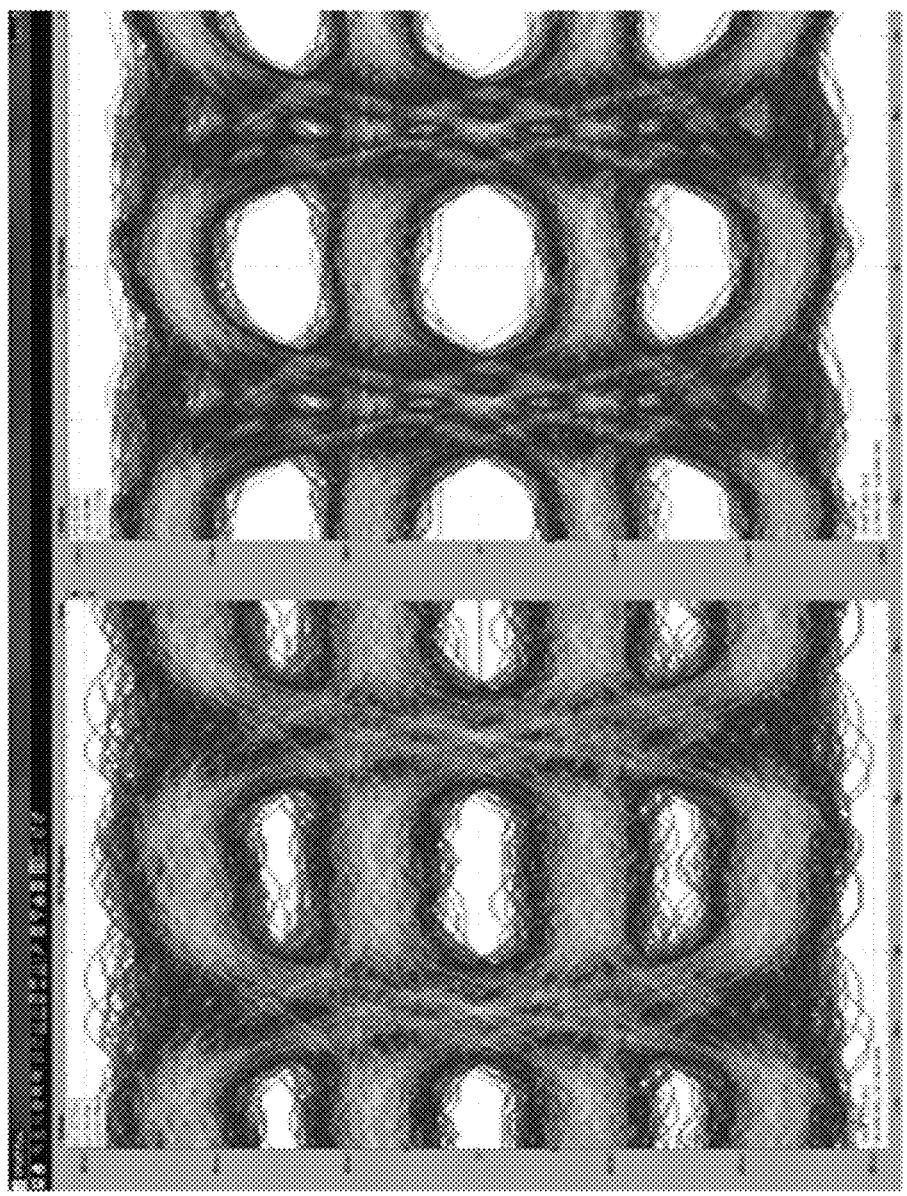
FIG. 21 illustrates eye diagrams for a digital signal with filtering/inverse filtering in accordance with embodiments described herein and without filtering/inverse filter.

FIG. 21 illustrates eye diagrams for an example signal detected with filtering 2202, as disclosed herein, for example by employing any filter configuration disclosed herein, and without filtering 2201. Diagrams 2201 and 2202 are generated based on a pulse amplitude modulation four (PAM-4) signal. An eye diagram depicts signal highs, signal lows, and transitions overlaid over multiple cycles, with lighter colors, depicted in grey scale, showing progressively increased signal activity. A closed eye diagram is an indication of increased noise, because a closed eye renders the differences between high, lows, and transitions less distinct. As shown, in diagram 2201, about 0.1 volts, in units of Vpp, of noise is added to the PAM-4 signal, noticeably closing the eye diagram. The eye diagram with filtering 2202 is significantly more open than the eye diagram without filtering 2201, which shows that the use of filtering as disclosed herein decreases signal noise and increases the oscilloscopes ability to distinguish between signal highs, lows, and transitions.

The forgoing disclosure may be implemented in various examples in many combinations. While not intended to be exhaustive, the following examples are presented as particular examples of the disclosed subject matter. The following examples are presented for the purposes of clarity and should not be considered as limiting to the scope of the present disclosure.

Example 1 includes an oscilloscope comprising: an input port configured to receive an analog signal via a DUT link negatively affected by frequency specific attenuation; an A/D converter configured to convert the analog signal from an analog domain to a digital signal in a digital domain; and an analog filter electrically coupled between the input port and the A/D converter, the analog filter configured to operate in the analog domain by adjusting a scale of selected high frequencies of the analog signal relative to selected low frequencies of the analog signal to adjust for the frequency specific attenuation occurring in the DUT link.

Example 2 includes the oscilloscope of Example 1, or any other example oscilloscope described herein, further comprising an oscilloscope channel noise source, wherein the analog filter adjusts the scale by amplifying high frequency waves in the analog signal, and wherein the analog filter is positioned between the input port and the oscilloscope channel noise source to prevent amplification of high frequency noise associated with the oscilloscope channel noise source.

Example 3 includes the oscilloscope of Examples 1-2, or any other example oscilloscope described herein, further comprising an inverse filter coupled to the A/D converter, the inverse filter configured to filter the digital signal in the digital domain with an inverse frequency response to the analog filter in the analog domain.

Example 4 includes the oscilloscope of Examples 1-3, or any other example oscilloscope described herein, further comprising a controller configured to iteratively adjust the analog filter in the analog domain to optimize a signal to noise ratio of the digital signal in the digital domain.

Example 5 includes the oscilloscope of Examples 1-4, or any other example oscilloscope described herein, in which the controller is further configured to: receive S-parameters associated with the analog filter; and employ the S-parameters of the analog filter to de-embed electrical effects of the analog filter from the analog signal or the digital signal.

Example 6 includes the oscilloscope of Examples 4-5, or any other example oscilloscope described herein, in which the controller iteratively adjusts the analog filter by employing SDLA PI commands.

Example 7 includes the oscilloscope of Examples 1-6, or any other example oscilloscope described herein, further comprising user controls configured to select frequency bounds for the selected high frequencies and the selected low frequencies based on received user input.

Example 8 includes the oscilloscope of Examples 1-7, or any other example oscilloscope described herein, further comprising user controls configured to adjust the analog filter in the analog domain to optimize a signal to noise ratio of the digital signal in the digital domain.

Example 9 includes a method of controlling an analog filter in an oscilloscope, the method comprising: receiving an analog signal via a device under test (DUT) link negatively affected by frequency specific attenuation; employing an analog to digital (A/D) converter to convert the analog signal from an analog domain to a digital signal; acquiring the digital signal in the digital domain; and employing a controller to iteratively increase a scale of selected high frequencies of the analog signal relative to selected low frequencies of the analog signal, the scale provided by the analog filter to the analog signal in the analog domain to increase a signal to noise ratio of the digital signal by adjusting for the frequency specific attenuation occurring in the DUT link.

Example 10 includes the method of Example 9, or any other example method described herein, in which the scale provided by the analog filter is iteratively increased until a maximum amplitude of the analog signal exceeds a conversion capacity of the A/D converter, causing clipping, and in which the method further comprises reducing the scale provided by the analog filter until no clipping occurs.

Example 11 includes the method of Example 10, or any other example method described herein, in which reducing the scale provided by the analog filter includes maintaining a specified margin between the maximum amplitude of the analog signal and the conversion capacity of the A/D converter.

Example 12 includes the method of Example 9, or any other example method described herein, in which the scale provided by the analog filter is iteratively increased until a maximum signal to noise ratio of the digital signal is obtained without causing clipping.

Example 13 includes the method of Examples 9-11, or any other example method described herein, in which the analog filter is an active analog filter configured to adjust the scale by adjustably amplifying the selected high frequencies.

Example 14 includes the method of Example 9-11, or any other example method described herein, in which the analog filter is a passive analog filter configured to adjust the scale by adjustably attenuating the selected low frequencies.

Example 15 includes an oscilloscope comprising: an input port configured to receive an analog signal via a DUT link negatively affected by frequency specific attenuation and via an external analog filter; an A/D converter configured to convert the analog signal from an analog domain to a digital signal in a digital domain; and a controller configured to: determine measurements of the digital signal in the digital domain; and control the external analog filter to adjust a scale of selected high frequencies of the analog signal relative to selected low frequencies of the analog signal to adjust for the frequency specific attenuation occurring in the DUT link in the analog domain based on a signal to noise ratio of the digital signal as measured in the digital domain.

Example 16 includes the oscilloscope of Example 15, or any other example oscilloscope described herein, in which controlling the external analog filter includes communicating SDLA PI commands with an external controller coupled to the external analog filter.

Example 17 includes the oscilloscope of Example 16, or any other example oscilloscope described herein, in which the SDLA PI commands include S-parameters to support signal de-embedding.

Example 18 includes the oscilloscope of Examples 15-17, or any other example oscilloscope described herein, in which the controller is further configured to: iteratively command the external analog to increase the scale of the selected high frequencies to the selected low frequencies until a maximum amplitude of the digital signal exceeds a conversion capacity of the A/D converter, causing clipping; and command the external analog to reduce the scale provided by the analog filter until no clipping occurs.

Example 19 includes the oscilloscope of Example 18, or any other example oscilloscope described herein, in which the controller commands the external analog to reduce the scale until a specified margin is maintained between the maximum amplitude of the digital signal and the conversion capacity of the A/D converter.

Example 20 includes the oscilloscope of Examples 15-19, or any other example oscilloscope described herein, further comprising user controls configured to select frequency bounds for the selected high frequencies and the selected low frequencies based on received user input.

Example 21 includes an external analog filter device comprising: an input port configured to receive an analog signal via a DUT link negatively affected by frequency specific attenuation; an output port configured to output the analog signal to an oscilloscope; and an analog filter electrically coupled between the input port and the output port, the analog filter configured to operate in the analog domain by adjusting a scale of selected high frequencies of the analog signal relative to selected low frequencies of the analog signal to adjust for the frequency specific attenuation occurring in the DUT link.

Example 22 includes the external analog filter device of Example 21, or any other example external analog filter device described herein, further comprising a controller coupled to the analog filter and configured to dynamically adjust the analog filter to optimize a SNR of the analog signal.

Example 23 includes the external analog filter device of Example 22, or any other example external analog filter device described herein, in which the controller is further configured to: communicate with an oscilloscope controller in the oscilloscope; and dynamically adjust the analog filter based on commands from the oscilloscope controller.

Example 24 includes the external analog filter device of Examples 22-23, or any other example external analog filter device described herein, further comprising a memory for storing S-parameters associated with the analog filter, in which the controller is further configured to communicate the S-parameters to the oscilloscope controller to support de-embedding of the analog filter by an SDLA process.

Example 25 includes the external analog filter device of Examples 22-24, or any other example external analog filter device described herein, in which the commands from the oscilloscope controller are received over an SDLA PI.

Example 26 includes the external analog filter device of Examples 22-25, or any other example external analog filter device described herein, in which the analog filter is dynamically adjusted by: iteratively increasing the scale provided by the analog filter based on commands from the oscilloscope controller until a maximum amplitude of the analog signal exceeds a conversion capacity of an A/D converter in the oscilloscope, causing clipping; and reducing the scale provided by the analog filter based on commands from the oscilloscope controller until no clipping occurs.

Example 27 includes the external analog filter device of Examples 26, or any other example external analog filter device described herein, in which reducing the scale provided by the analog filter includes maintaining a specified margin between the maximum amplitude of the analog signal and the conversion capacity of the A/D converter.

Example 28 includes the external analog filter device of Examples 22-25, or any other example external analog filter device described herein, in which the scale provided by the analog filter is iteratively increased based on commands from the oscilloscope controller until a maximum signal to noise ratio of the digital signal is obtained without causing clipping at an A/D converter in the oscilloscope.

Example 29 includes the external analog filter device of Examples 22-28, or any other example external analog filter device described herein, example, in which the controller is further configured to communicate analog filter settings to the oscilloscope controller to support computation of an inverse filter at the oscilloscope corresponding to the analog filter.

Example 30 includes the external analog filter device of Examples 22-29, or any other example external analog filter device described herein, in which the controller is further configured to adjust the analog filter based on user commands received via the oscilloscope controller.

Example 31 includes the external analog filter device of Examples 21-30, or any other example external analog filter device described herein, in which the controller is further configured to select frequency bounds for the selected high frequencies and frequency bounds for the selected low frequencies based on the user commands received via the oscilloscope controller.

Example 32 includes the external analog filter device of Examples 21-31, or any other example external analog filter device described herein, in which the analog filter is a programmable passive analog filter.

Example 33 includes the external analog filter device of Examples 21-31, or any other example external analog filter device described herein, in which the analog filter is a programmable active analog filter.

Example 34 includes the external analog filter device of Examples 21-31, or any other example external analog filter device described herein, in which the analog filter is a programmable active analog filter coupled in series with a programmable passive analog filter.

Example 35 includes a method of controlling a analog filter in an external analog filter device, the method comprising: receiving, at an input port, an analog signal via a DUT link negatively affected by frequency specific attenuation; transmitting, at an output port, the analog signal toward an oscilloscope; receiving commands from an oscilloscope controller in the oscilloscope; and based on the commands, adjusting the analog filter to iteratively increase a scale of selected high frequencies of the analog signal relative to selected low frequencies of the analog signal, the scale provided by the analog filter to the analog signal to increase a signal to noise ratio of the analog signal transmitted towards the oscilloscope by adjusting for the frequency specific attenuation occurring in the DUT link.

Example 36 includes the method of Example 35, or any other example method described herein, in which the scale provided by the analog filter is iteratively increased, based on the commands from the oscilloscope, until a maximum amplitude of the analog signal exceeds a conversion capacity of an A/D converter in the oscilloscope, causing clipping, and in which the method further comprises reducing the scale provided by the analog filter until no clipping occurs at the oscilloscope.

Example 37 includes the method of Example 36, or any other example method described herein, in which the commands from the oscilloscope are based on analog measured responses read from an oscilloscope memory in the oscilloscope.

Example 38 includes the method of Examples 36-37, or any other example method described herein, in which reducing the scale provided by the analog filter includes maintaining a specified margin between the maximum amplitude of the analog signal and the conversion capacity of the A/D converter in the oscilloscope.

Example 39 includes the method of Example 35, or any other example method described herein, in which the scale provided by the analog filter is iteratively increased until a maximum signal to noise ratio of the analog signal is obtained without causing clipping at the oscilloscope.

Example 40 includes the method of Examples 35-39, or any other example method described herein, in which the analog filter is an active analog filter configured to adjust the scale by adjustably amplifying the selected high frequencies.

Example 41 includes the method of Examples 35-39, or any other example method described herein, in which the analog filter is a passive analog filter configured to adjust the scale by adjustably attenuating the selected low frequencies.

Example 42 includes the method of Examples 35-41, or any other example method described herein, example, in which receiving commands from the oscilloscope includes receiving a selection frequency bounds for the selected high frequencies and frequency bounds for the selected low frequencies.

Example 43 includes the method of Examples 35-42, or any other example method described herein, further comprising communicating S-parameters to the oscilloscope controller to support de-embedding of the analog filter by an SDLA process.

Example 44 includes an oscilloscope comprising: an input port configured to receive an analog signal via a DUT link negatively affected by frequency specific attenuation; an A/D converter configured to convert the analog signal from an analog domain to a digital signal in a digital domain; and a analog filter configured to operate in the digital domain by adjusting a scale of selected high frequencies of the digital signal relative to selected low frequencies of the digital signal to adjust for the frequency specific attenuation occurring to the analog signal in the DUT link.

Example 45 includes the oscilloscope of Examples 44, or any other example oscilloscope described herein, in which the analog filter is a programmable filter implemented by a DSP.

Example 46 includes the oscilloscope of Examples 44-45, or any other example oscilloscope described herein, further comprising a controller configured to iteratively adjust the analog filter to optimize an SNR of the digital signal as output from the A/D converter.

Example 47 includes the oscilloscope of Example 46, or any other example oscilloscope described herein, in which the controller iteratively adjusts the analog filter based on analog measured responses read from a memory.

Example 48 includes the oscilloscope of Examples 44-47, or any other example oscilloscope described herein, further comprising user controls configured to select frequency bounds for the selected high frequencies and the selected low frequencies based on received user input.

Example 49 includes the oscilloscope of Examples 44-48, or any other example oscilloscope described herein, in which the analog filter is an active analog filter configured to adjust the scale by adjustably amplifying the selected high frequencies.

Example 50 includes the oscilloscope of Examples 44-48, or any other example oscilloscope described herein, in which the analog filter is a passive analog filter configured to adjust the scale by adjustably attenuating the selected low frequencies.

Example 51 includes the oscilloscope of Examples 44-50, or any other example oscilloscope described herein, further comprising user controls configured to adjust a frequency response of the analog filter based on received user input.

Example 52 includes a noise reduction device for a test and measurement system, comprising: a frequency specific analog filter configured to adjust, in accordance with a first frequency transfer function, a first frequency of an electrical signal relative to a second frequency of the electrical signal to produce a modified signal; an analog-to-digital converter coupled with an output of the analog filter and configured to produce a digital signal based on the modified signal; and a digital filter coupled with the analog-to-digital converter and configured to: receive the digital signal, produce a filtered signal, from the digital signal, based on a second frequency transfer function that is substantially an inverse of the first frequency transfer function, and output the filtered signal for additional processing by the test and measurement system.

Example 53 includes the noise reduction device of Example 52, or any other example device described herein, and wherein the frequency specific analog filter is an active filter configured to boost the first frequency of the electrical signal relative to the second frequency of the electrical signal to produce the modified signal.

Example 54 includes the noise reduction device of Examples 52, or any other example device described herein, and wherein the frequency specific analog filter is a passive filter configured to attenuate the second frequency of the electrical signal relative to the first frequency of the electrical signal, and wherein the noise reduction device further comprises an amplifier configured to boost both the first frequency and the attenuated second frequency to produce the modified signal.

Example 55 includes the noise reduction device of Examples 52-54, or any other example device described herein, and wherein the frequency specific analog filter is a CTLE.

Example 56 includes the noise reduction device of Examples 52-55, or any other example device described herein, and further comprising a processor configured to select a scale of the first frequency transfer function to increase a SNR of the modified signal.

Example 57 includes the noise reduction device of Examples 52-56 or any other example device described herein, and wherein the test and measurement system is an oscilloscope.

Example 58 includes the noise reduction device of Examples 52-57, or any other example device described herein, and wherein the digital filter is further configured to de-embed parasitic effects associated with the frequency specific analog filter from the filtered signal.

Example 59 includes the noise reduction device of Examples 52-58, or any other example device described herein, and further comprising a processor configured to: receive Scattering (S) parameters describing parasitic effects associated with the frequency specific analog filter, and employ the S-parameters as part of a SDLA process to cause the digital filter to de-embed the parasitic effects associated with the frequency specific analog filter.

Example 60 includes the noise reduction device of Examples 52-59, or any other example device described herein, and further comprising a processor configured to: adjust the first frequency transfer function by iteratively increasing a scale of the first frequency relative to the second frequency until a maximum amplitude of the modified signal exceeds a conversion capacity of the analog-to-digital converter, causing clipping; and then adjust the first frequency transfer function to decrease the scale of the first frequency relative to the second frequency until no clipping occurs.

Example 61 includes the noise reduction device of Examples 52-60, or any other example device described herein, and in which the processor if further configured to maintain a specified margin between the maximum amplitude of the modified signal and the conversion capacity of the analog-to-digital converter.

Example 62 includes a method for implementing the noise reduction device of Examples 52-61, or any other example device described herein.

Examples of the invention may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

Aspects of the present disclosure operate with various modifications and in alternative forms. Specific aspects have been shown by way of example in the drawings and are described in detail herein above. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more machine-readable (e.g., computer-readable) media, which may be read and executed by one or more processors. Such instructions may be referred to as a computer program product. Machine-readable media can be any available media and includes both volatile and nonvolatile media, removable and non-removable media. By way of example, and not limitation, machine-readable media may comprise machine-readable storage media and communication media. Machine-readable storage media includes volatile and nonvolatile, removable and non-removable media implemented in any method or technology for storage of information such as machine-readable instructions, data structures, program modules or other data. Machine-readable storage media includes, but is not limited to, Random Access Memory (RAM), Read Only Memory (ROM), Electrically Erasable Programmable Read-Only Memory (EEPROM), flash memory or other memory technology, Compact Disk Read Only Memory (CD-ROM), digital versatile disks (DVD) or other optical disk storage, magnetic cassettes, magnetic tape, magnetic disk storage or other magnetic storage devices, or any other medium which can be used to store the desired information and which can be accessed by a computing device. Machine-readable storage media excludes signals per se and transitory forms of signal transmission.

Embodiments of the present disclosure may include a test and measurement instrument. The test and measurement instrument can include a waveform monitor, vectorscope, logic analyzer, or oscilloscope, among other suitable measurement devices. While this disclosure gives particular emphasis to an oscilloscope, this is merely for ease of reference and it should be understood that the scope of the disclosure should not be limited thereto, and can be embodied within a variety of test and measurement devices, as well as other devices.

We claim:

1. A noise reduction device for a test and measurement system, comprising:
   an analog filter configured to adjust a first frequency band of an electrical signal relative to a second frequency band of the electrical signal in accordance with a first frequency transfer function to produce a modified signal;
   an analog-to-digital converter coupled with an output of the analog filter and configured to produce a digital signal based on the modified signal; and
   a digital filter coupled with the analog-to-digital converter and configured to:
      produce a filtered signal, from the digital signal, based on a second frequency transfer function that is an inverse of the first frequency transfer function, and output the filtered signal for additional processing by the test and measurement system.

2. The noise reduction device of claim 1, wherein the analog filter is an active filter configured to boost the first frequency band of the electrical signal relative to the second frequency band of the electrical signal to produce the modified signal.

3. The noise reduction device of claim 1, wherein the analog filter is a passive filter configured to attenuate the second frequency band of the electrical signal relative to the first frequency band of the electrical signal, and wherein the noise reduction device further comprises an amplifier configured to boost both the first frequency band and the attenuated second frequency band to produce the modified signal.

4. The noise reduction device of claim 1, wherein the analog filter is a continuous time linear equalizer (CTLE).

5. The noise reduction device of claim 1, further comprising a processor configured to select a scale of the first frequency transfer function to increase a Signal to Noise Ratio (SNR) of the modified signal.

6. The noise reduction device of claim 1, wherein the test and measurement system is an oscilloscope.

7. The noise reduction device of claim 1, wherein the digital filter is further configured to de-embed parasitic effects associated with the analog filter from the filtered signal.

8. The noise reduction device of claim 7, further comprising a processor configured to:
   receive Scattering (S) parameters describing parasitic effects associated with the analog filter, and
   employ the S-parameters as part of a serial data link analysis (SDLA) process to cause the digital filter to de-embed the parasitic effects associated with the analog filter.

9. The noise reduction device of claim 1, further comprising a processor configured to:
   adjust the first frequency transfer function by iteratively increasing a scale of the first frequency band relative to the second frequency band until a maximum amplitude of the modified signal exceeds a conversion capacity of the analog-to-digital converter, causing clipping; and
   then adjust the first frequency transfer function to decrease the scale of the first frequency band relative to the second frequency band until no clipping occurs.

10. The noise reduction device of claim 9, in which the processor if further configured to maintain a specified margin between the maximum amplitude of the modified signal and the conversion capacity of the analog-to-digital converter.

11. A method comprising:
   modifying, via an analog filter, a first frequency band of an incoming electrical signal relative to a second frequency band of the incoming electrical signal to produce a modified signal including the modified first frequency band and the second frequency band;
   converting the modified signal to a digital signal;
   applying a digital filter to the digital signal to produce a filtered signal, the digital filter configured to compensate for a frequency response of the analog filter; and
   storing the filtered signal in a memory for additional processing.

12. The method of claim 11, wherein modifying the incoming electrical signal includes boosting the first frequency band of the incoming electrical signal relative to the second frequency band of the incoming electrical signal to produce the modified signal.

13. The method of claim 11, wherein modifying the incoming electrical signal includes:
attenuating the second frequency band of the incoming electrical signal relative to the first frequency band of the incoming electrical signal; and
boosting both the first frequency band and the attenuated second frequency band to produce the modified signal.

14. The method of claim 11, wherein the analog filter is a continuous time linear equalizer (CTLE).

15. The method of claim 11, further comprising selecting, via a processor, a scale of the first frequency band relative to the second frequency band to increase a Signal to Noise Ratio (SNR) of the modified signal.

16. The method of claim 11, wherein the method is implemented in an oscilloscope.

17. The method of claim 11, further comprising de-embedding parasitic effects associated with the analog filter from the filtered signal.

18. The method of claim 17, further comprising a processor configured to:
receive Scattering (S) parameters describing the parasitic effects associated with the analog filter; and
employing the S-parameters as part of a serial data link analysis (SDLA) process to de-embed the parasitic effects associated with the analog filter.

19. The method of claim 11, further comprising:
iteratively increasing a scale of the first frequency band relative to the second frequency band until a maximum amplitude of the modified signal exceeds a conversion capacity of an analog-to-digital converter that converts the modified signal to the digital signal, causing clipping; and
then decreasing the scale of the first frequency band relative to the second frequency band until no clipping occurs.

20. The method of claim 19, further comprising maintaining a specified margin between the maximum amplitude of the modified signal and the conversion capacity of the analog-to-digital converter.

* * * * *